US007986805B2

(12) United States Patent
Nagaoka

(10) Patent No.: US 7,986,805 B2
(45) Date of Patent: Jul. 26, 2011

(54) ACOUSTIC DIAPHRAGM

(76) Inventor: Tadashi Nagaoka, Nishinomiya (JP)

(*) Notice: Subject to any disclaimer, the term of this patent is extended or adjusted under 35 U.S.C. 154(b) by 322 days.

(21) Appl. No.: 12/230,778

(22) Filed: Sep. 4, 2008

(65) Prior Publication Data

US 2009/0129624 A1 May 21, 2009

Related U.S. Application Data

(62) Division of application No. 11/039,204, filed on Jan. 19, 2005, now Pat. No. 7,483,545.

(60) Provisional application No. 60/586,065, filed on Jul. 7, 2004.

(51) Int. Cl.
*H04R 1/00* (2006.01)
*H05K 5/00* (2006.01)
*H04R 7/00* (2006.01)

(52) U.S. Cl. ......................... 381/424; 181/144; 181/163

(58) Field of Classification Search .......... 381/423–426; 181/157, 158, 163, 164, 167, 144
See application file for complete search history.

(56) References Cited

U.S. PATENT DOCUMENTS

| | | | | |
|---|---|---|---|---|
| 1,757,451 | A | 5/1930 | Crane | |
| 4,146,744 | A * | 3/1979 | Veranth | 181/163 |
| 2002/0027040 | A1 | 3/2002 | Sato et al. | |

FOREIGN PATENT DOCUMENTS

| | | |
|---|---|---|
| GB | 191405038 | 2/1915 |
| JP | 5324812 | 7/1976 |
| JP | 56019298 | 2/1981 |
| JP | 58-108896 | 6/1983 |
| JP | 58108896 | 6/1983 |
| JP | 58127499 | 7/1983 |
| JP | 60007299 | 1/1985 |
| JP | 60083497 | 5/1985 |
| JP | 61009098 | 1/1986 |
| JP | 62-149296 | 7/1987 |
| JP | 01037199 | 2/1989 |
| JP | 1037199 | 2/1989 |
| JP | 8140183 | 5/1996 |
| JP | 9224297 | 8/1997 |
| JP | 11215589 | 8/1999 |

OTHER PUBLICATIONS

European Search Report for Application No. 05012482.5, mailed Nov. 27, 2006.

(Continued)

*Primary Examiner* — Brian Ensey
(74) *Attorney, Agent, or Firm* — Edwards Angell Palmer & Dodge LLP

(57) ABSTRACT

An acoustic diaphragm is disclosed having a plurality of acoustic elements supported by the diaphragm. In a preferred form, each element is coupled to a driver and extends radially at a uniform acute angle to a normal of the driver. In the preferred embodiment, a plural layer of the elements is arranged so that the direction of each element is out-of-phase relative to each other, preferably in the range of approximately ninety degree. An element is also supplemental to the conventional acoustic diaphragm. The improved acoustic diaphragm is used in electric acoustic and acoustic electric transducer systems having improved performance at wide frequency range.

2 Claims, 19 Drawing Sheets

OTHER PUBLICATIONS

*Acoustic Engineering*, Olson, Van Norstrand Company, Inc., New Jersey, 1957.
An Anthology of Articles on Loudspeakers from the Pages of the Journal of the Audio Engineering Society, vol. 1-vol. 25, 1953-1977, 2nd Edition, pp. 7-15, Audio Engineering Society, Inc., New York, NY.
*Speech and Hearing Science*, Zemlin, prof., 1981, Prentice hall, Inc., Englewood Cliffs, NJ 07632, p. 550.
*Atlas of Otology*, Jikagaku Atolasu, Y Na=omura, MD et al. 1974, Chugai-Igku Co., Tokyo, p. 3.
*Middle Ear, Inner Ear Scanning Microscope Atlas*, Harada, 1980, Kanahara & Co., Ltd., Tokyo, pp. 4-5.
*A Diffraction Grating in Nature*, The Nihon Keizai Shinbun (Daily news), Nikkei, Oct. 27, 2002, p. 26.
*The World of New Fibers*, Nyu-senni no sekai), T. Hongu, Nikkankougyoushinbunsha, Tokyo, 1988, pp. 50-51.
*The World of High-Tech Fibers*, Haiteku-senni no sekai), Hongu, Nikkankougyoushinbunsha, Tokyo, 1999, pp. 10-11.
*The Ultrasonic Engineering*, Chouonpa Kougaku, Shimakawa, Kougyo Chousakai Publication Co., Ltd., 1997, p. 17.

* cited by examiner (a) (b)

ACOUSTIC DIAPHRAGM

RELATED APPLICATIONS

This application claims priority to U.S. Provisional application No. 60/586,065, filed Jul. 7, 2004.

BACKGROUND OF THE INVENTION

1. Field of the Invention

This invention relates to the field of electric to acoustic transducer systems and acoustic to electric transducer systems, and more specifically, to a system for an improved unique diaphragm having a plurality of acoustic elements supported by the diaphragm.

2. Description of the Related Art

Common electric to acoustic transducer devices, and acoustic to electric transducer devices, are well documented in the following text and anthologies: *Acoustic Engineering*, Harry F. Olson, Ph.D., Van Norstrand Company, Inc., New Jersey, 1957 (Library of Congress catalogue card No. 57-8143) (hereinafter referred to as "Olson"); Loudspeakers, *An anthology of articles on loudspeakers from the pages of the Journal of the Audio Engineering Society* Vol. 1-Vol. 25 (1953-1977), 2nd Edition, Audio Engineering Society, Inc., New York, N.Y.; and *Loudspeakers, An anthology of articles on loudspeakers from the pages of the Journal of the Audio Engineering Society* Vol. 26-Vol. 31 (1978-1983), Audio Engineering Society, Inc., New York, N.Y., each of which are hereby incorporated by reference. Many design efforts have focused not only on the physical characteristics of the materials, such as high modulus E, low-density ρ, high E/ρ and low over all weight, but also on configuration of an acoustic diaphragm. In one approach, U.S. Pat. No. 1,757,451 (1930, Crane) consists of the impressed holes, ribs, or humps in the diaphragm, which may be filled with a damping material and preferably arranged in a logarithmic curve. This attempt related to a method of limiting or attenuating standing wave or divisional vibration by modification of the propagation characteristics of the diaphragm.

There have been some prior attempts at solve the problem of undesirable vibrations by incorporating layered fibers into an acoustic diaphragm. For example, Japanese Patent Application S58-108896 (1983, Guyot) disclosed a loudspeaker cone formed by a laminated high elasticity fiber sheet with polymer. Accordingly, Japanese Issued U.S. Pat. No. 2,693,447 (1997, Tomiyake, et al.) disclosed a loudspeaker cone consisting of a high elasticity fiber with polymer stripes where every stripe is directed to the radial direction from the cone neck. Further, Japanese Issued Patent No. 0946,038 (1979, Morita, et al.) describes a dome-shaped diaphragm consisting of a high elasticity fiber with polymer wherein all fibers are directed to longitude of the dome.

However, in each of the applications described above, the construction and techniques employed did not take advantage of nor incorporate the advantages of the natural characteristics of layering as seen in a human eardrum. Another example of an advantageous naturally occurring design to solve the problem of undesirable vibrations is one which reflects the advantages of the natural layered-fiber characteristics of a feather. Yet, in each of the applications described above, the construction and techniques employed did not take advantage of nor incorporate advantageous characteristics of a feather. Thus, an acoustic diaphragm having the advantageous characteristics of a human eardrum and of a feather has not been achieved.

BRIEF SUMMARY OF THE INVENTION

Various aspects of the present invention may be illustrated by an understanding of the layering of elements of the human eardrum, as well as the layering of a feather, to produce an improved acoustic diaphragm based on such an understanding natural principles.

It is an object of this invention to provide a naturally oriented acoustic diaphragm for use not only an electric to acoustic transducer systems including speaker, headphone, earphone, telephone and hearing aids, but also in acoustic to electric transducer systems such as a microphone.

It is another object of the invention to provide an improved naturally oriented acoustic diaphragm that is interchangeable with current electric to acoustic transducer and acoustic to electric transducer devices, apparatus and systems wherein significant improvements are obtained.

It is another object of the invention to provide an improved naturally oriented acoustic diaphragm having a simple construction and that is relatively inexpensive to manufacture.

It is another object of the invention to provide an improved naturally oriented acoustic diaphragm that is weatherproof and has persistency.

It is another object of the invention to provide a method of making a naturally oriented acoustic diaphragm.

It is another object of the invention to provide an electric to acoustic transducer and an acoustic to electric transducer using a naturally oriented acoustic diaphragm.

The above, and other objects of the invention, are achieved by an acoustic diaphragm with a driver connected to the acoustic diaphragm for communication of acoustic energy comprising:

(a) a plurality of acoustically functional and active elements (hereinafter referred to as "acoustic elements") supported by the acoustic diaphragm (associated with an eardrum's fibers and a feather's twigs);

(b) each element having a proximate end coupled to a driver (associated with an eardrum's malleus and a feather's bough) and (c) extended radially at a uniform acute angle to normal of the driver (associated with feather's twig which is coupled and extend from the bough at a uniform acute angle); and (d) the elements oriented in a selected stiffness pattern surrounding the driver (associated with an eardrum's fibers and a feather's twig.)

Even further improvements in performance are achieved by dual-layer construction of the acoustic diaphragm so that:

(e) the direction of the fibers of one layer is out-of-phase relative to the direction of the fibers of a second layer (associated with an eardrum's fiber, radial and circular, and a feather's overlaid twigs).

A dual layer of the acoustic elements, in an acute angle to normal to the driver, is aligned out-of-phase against the other layer, providing significant improvements to the characteristics of the acoustic diaphragm.

However, the inventor emphasizes that noticeable improvements in an acoustic diaphragm are achieved even in a diaphragm having only a single layer of acoustic element when the matrix has a stiffness of a conventional acoustic diaphragm or less.

The above and other objects of the invention are achieved with a method of making a naturally oriented acoustic diaphragm with a driver connected to the diaphragm for communication of acoustic energy having a plurality of acoustic elements equally spaced and a matrix supported by the diaphragm, and extending radially at a uniform acute angle to normal at each connection to the driver, with the acoustic elements oriented in a selected stiffness pattern surrounding the driver.

A further method of making a naturally oriented acoustic diaphragm is achieved by using a fiber-reinforced-plastic, wherein fiber is the acoustic element and plastic is the matrix.

A further method of making the naturally oriented acoustic diaphragm is achieved by supplementing the conventional acoustic diaphragm with the acoustic elements described herein.

A further method of making a naturally oriented acoustic diaphragm is achieved by plastic-molding a diaphragm with the acoustic elements. The principle and methods of the invention are also applied to a plane drive acoustic diaphragm, wherein a vibratory member having a plurality of elements formed from an electrically excited plane drive system is adapted to said acoustic diaphragm to cause each element to vibrate when the exciter is electrically or electromagnetically energized, each element having a proximate end coupled to a central portion of the acoustic diaphragm and extending radially at a uniform acute angle to normal of a central portion of the diaphragm.

The principles and methods of the present invention can be applied in every species of acoustic diaphragm, regardless of the frequency range, and substantial improvement can be obtained over the conventional acoustic diaphragm.

The above and other objects of the invention may also be achieved by an improved electric to acoustic and acoustic to electric transducer system using a naturally-oriented acoustic diaphragm with acoustic elements for producing sound and electric signals. Such a transducer may also include a voice coil assembly. A field structure, in its common form, includes a magnet and a pole piece that generates an intense, symmetrical, magnetic field in a gap proximate to the voice coil. A frame structure is coupled to and supports the acoustic diaphragm with a voice coil and a magnetic field structure.

DETAILED DESCRIPTION OF EXEMPLARY EMBODIMENTS

Figure 1A:
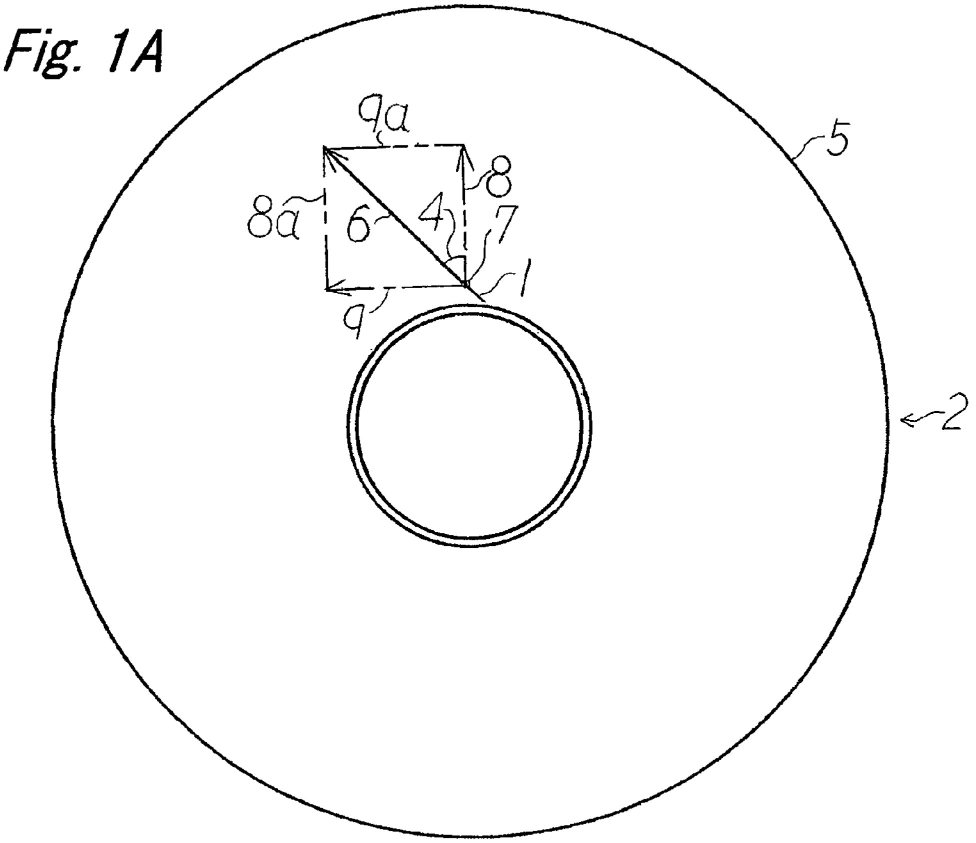
FIG. 1A shows a cone-type acoustic diaphragm with an acoustic element illustrating the acoustic energy transmissions of points on the diaphragm.

An acoustic diaphragm is described herein. In the following description, numerous specific details are set forth by way of exemplary embodiments in order to provide a more thorough description of the present invention. It will be apparent, however, to one skilled in the art, that the present invention may be practiced without these specific details. In other instances, well-known features have not been described in detail so as not to obscure the invention. The preferred embodiments of the inventions are described herein in the Figures and Detailed Description. Unless specifically noted, it is intended that the words and phrases in the specification and claims be given the ordinary and accustomed meaning as understood by those of ordinary skill in the applicable art or arts. If any other meaning is intended, the specification will specifically state that a special meaning is being applied to a word or phrase.

The present invention uses an alternative approach to those of the prior art, by taking "nature" into account to solve the problem of undesirable vibrations with efficient and uniform acoustic energy transmission, damping and reinforcement in acoustic diaphragms. As described in the Olson, (p. 558,) "[t]he ultimate significant destination of all reproduced sound is the human ear." Human hearing is initiated by sound vibrating the eardrum.

In practice, original sound is transformed into an electric signal by the diaphragm of a microphone, transmitted electrically, and then regenerated as sound by a diaphragm in sound reproduction equipment in order to vibrate the above mentioned eardrum.

It is true that the human ear is still, ultimately, the best judge of sound quality, although more advanced measuring equipment and sophisticated measuring methods have been developed and introduced. Still, considerable discrepancy exists between data obtained by measuring equipment and actual sound as qualified by the human auditory sense.

According to Olson (pp. 558-9,) "[t]he physiological and psychological effects of the reproduced sound are the most important factors in any sound reproducing system . . . . An enormous amount of valuable data relating to speech and hearing have been collected. This information is extremely useful in the development and design of sound reproducing equipment . . . . When a sound wave impinges upon the ear, it enters the ear canal and causes the eardrum to vibrate."

The inventor herein considers a human "eardrum" as of the ultimate acoustic diaphragm, as obtained through an evolutionary process.

The Human Eardrum as a Model for an Acoustic Diaphragm

Referring to the Speech and Hearing Science, (p. 550), Willard R. Zemlin, prof., 1981 by Prentice Hall, Inc., Englewood Ciffs, N.J. 07632, (referred to below as "Zemlin") and ATLAS of OTOLOGY, (Jikagaku Atolasu), (p. 54), Yasuya Nomura, M.D., Fumihisa Hiraide, M.D., 1974 by CHUGAI-IGAKU Co., Tokyo, (referred to below as "Nomura), the contents of each of which are hereby incorporated by reference. Zemlin describes a human eardrum as follows: "[s]tructurally the eardrum consists of three layers of tissue: a thin outer cutaneous layer, which is continuous with the lining of the external auditory meatus; a fibrous middle layer, which is largely responsible for the resilience of the eardrum; and an internal layer of serous (mucous) membrane, which is continuous with the lining of the tympanic cavity. The fibrous layer actually contains two layers closely connected one with the other. The more superficial of the two consists of fibers that radiate from the center toward the periphery. These fibers are rather evenly distributed throughout most of the tympanic membrane, giving the fibrous layer a fancied resemblance to spokes in a wheel (referred to herein as "radial fibers.") The deeper layer is composed of concentric rings of fibrous tissue which have an uneven distribution (referred to herein as "circular fibers.") Their density is greatest toward the periphery, and in the center where the membrane attaches to the end of the manubrium of the malleus."

As described above, the two fibrous layers are coupled to the malleus and closely connected, but neither weaved nor knitted tissue. It has been medically proven that these layers can be independently separated. See, *Middle Ear, Inner Ear Scanning Microscope Atlas*, (Chuuji, Naiji Sousadenken Atolasu), (pp. 4-5), Yasuo Harada, Prof., 1980 by Kanahara & Co., LTD. Tokyo, (hereinafter, "Harada") the contents of which are hereby incorporated by reference.

An acoustic diaphragm design may be inspired by the human eardrum, which may be characterized by:

(1) both a radial fiber and circular fibers coupled to a driver;

(2) efficient and uniform transmission of acoustic energy achieved without the barrier of twist or twine due to weave or knit;

(3) adequate internal loss induced in the fiber material itself, where additional damping is given by the out-of-phase motion of each layer when vibrated, such that the radial fiber moves in a circular direction and the circular fiber moves in a radial direction;

(4) reduction of standing waves reflected from the periphery and manubrium of the malleus by circular fiber;

(5) reinforce the eardrum by the fiber stiffness within adequate weight. As explained above, a fiber of an eardrum is an example of a functionally active element which the inventor hereinafter calls an "acoustic element"; and (6) an eardrum coupled to a hearing organ by a leverage type mechanical linkage. Consequently, the eardrum configuration is not directly applicable to the acoustic diaphragm that requires mechanically isolated reciprocal motion.

A Feather as a Model for an Acoustic Diaphragm

Another embodiment of the novelty of present invention is illustrated by another example of a natural damped membrane—a feather. A feather configuration is a superior model for an acoustic diaphragm since it has remained the same for over one hundred million years.

A close-up of a feather is shown in *The Nihon Keizai Shinban* (Daily News), Oct. 27, 2002, p. 26, "A Diffraction Grating in Nature" (hereinafter, "Nikkei") hereby incorporated by reference. For discussion in the present description, a feather is comprised of a non-linear needle-leaf like "twig" (aerodynamic energy 20 transmitting element) coupled to a "bough" (a driver) at an acute angle and is aligned on a single layer. Another twig layer, which is coupled to an adjacent bough, is cross-plied to the first twig layer. A feather's twig is an aerodynamical functional element with air as the matrix.

Accordingly, a feather configuration is characterized by:

(1) A twig coupled to a bough at an acute angle. The advantage of an acute angled twig is reinforcement of the bough in two dimensions;

(2) Efficient and uniform transmission of aerodynamic energy without barrier of twist or twine due to weave or knit;

(3) Adequate internal loss induced by the twig itself, additional damping given by the out-of-phase motion of each twig layer;

(4) Reduction of standing waves reflected from the bough and attenuation of vibration and flutter of the feather by the twig;

(5) Configuration of the aerodynamic membrane by a fibrous twig within adequate weight; and (6) Extended plane comprised of bilateral boughs with twigs and air as the matrix transmits an aerodynamic driving force based on a mechanical connection. Consequently, a feather configuration is not directly applicable to an acoustic diaphragm that requires a mechanically isolated reciprocal motion and driver composed of a closed loop mode.

Embodiments of the Invention

The acoustic element of the present invention is inspired by and has the novelty of an eardrum's fiber and a feather's twig, as described above. The physical configuration of one preferred embodiment of the present invention is shown in FIG. 1A. Acoustic element 1 is supported by cone-shaped acoustic diaphragm 2. Acoustic element 1 is coupled to driver 3 at acute angle 4 to normal 8 of driver 3 and extends outwardly to boundary 5. Acoustic energy transmission 6 of point 7 is considered to have two vectors, one normal component as shown at 8, and one tangential component as shown at 9. In other words, acoustic element 1 gives acoustic energy to the area comprised of 8, 9*a*, 8*a* and 9 in FIG. 1A.

Figure 1B:
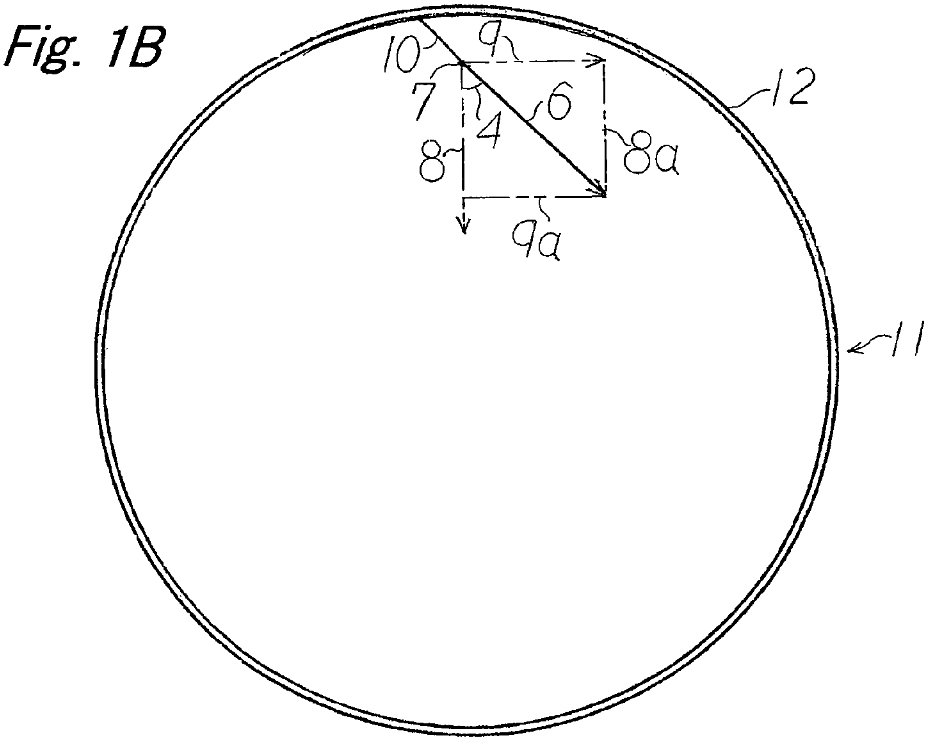
FIG. 1B shows a dome-type acoustic diaphragm with an acoustic element illustrating the acoustic energy transmissions of points on the diaphragm.

In FIG. 1B, acoustic element 10 is supported by dome-shaped acoustic diaphragm 11. Acoustic element 10 is coupled to driver 12 at acute angle 4 to normal 8 of driver 12 and extends inwardly to center 13. The acoustic energy transmission 6 of point 7 is considered to have two vectors, one normal component as shown at 8, and one tangential component as shown at 9. In other words, the acoustic element 10 gives acoustic energy to the area comprised of 8, 9*a*, 8*a* and 9 in FIG. 1B.

Concurrently, reinforcement for a normal component vector and a tangential component vector are given by acoustic elements 1 and 10. Internal loss is thus induced between acoustic elements 1 and 10 and the matrix of the acoustic diaphragm.

A normal component and a tangential component are equalized when said acute angle 4 is a 45-degree angle, wherein the area comprised of 8, 9*a*, 8*a*, 9 becomes maximum. A 45-degree angle, plus or minus 10-degrees, is acceptable because of the reduction of the above mentioned vector is less than 30%. An acute angle is determined with respect to the tangential plane on the acoustic diaphragm.

Figure 2A:
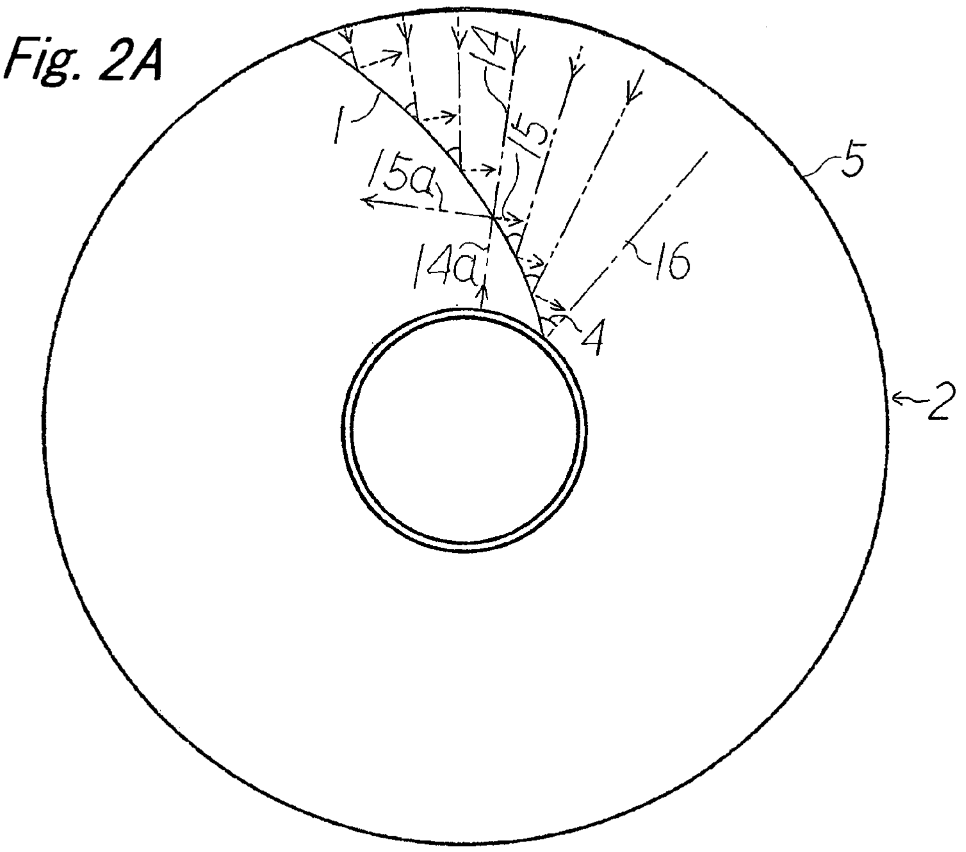
FIG. 2A shows a cone-type acoustic diaphragm with an acoustic element illustrating the reflections of the residual sound energies.

Referring to FIG. 2A, acoustic element 1 is supported by cone-shaped acoustic diaphragm 2, acoustic element 1 having a proximate end coupled to driver 3 and extending radially at acute angle 4 to normal 16, wherein a distal end is spaced outwardly from driver 3 in the direction of acoustic diaphragm boundary 5. In FIG. 2A, residual sound energy 14 from boundary 5 is reflected in direction 15 by means of acoustic element 1 on acoustic diaphragm 2, and thus induces internal loss and attenuates standing waves. Residual sound energy 14*a* from driver 3 is reflected in direction 15*a* by means of acoustic element 1 on acoustic diaphragm 2, and thus induces internal loss and attenuates standing waves.

Figure 3A:
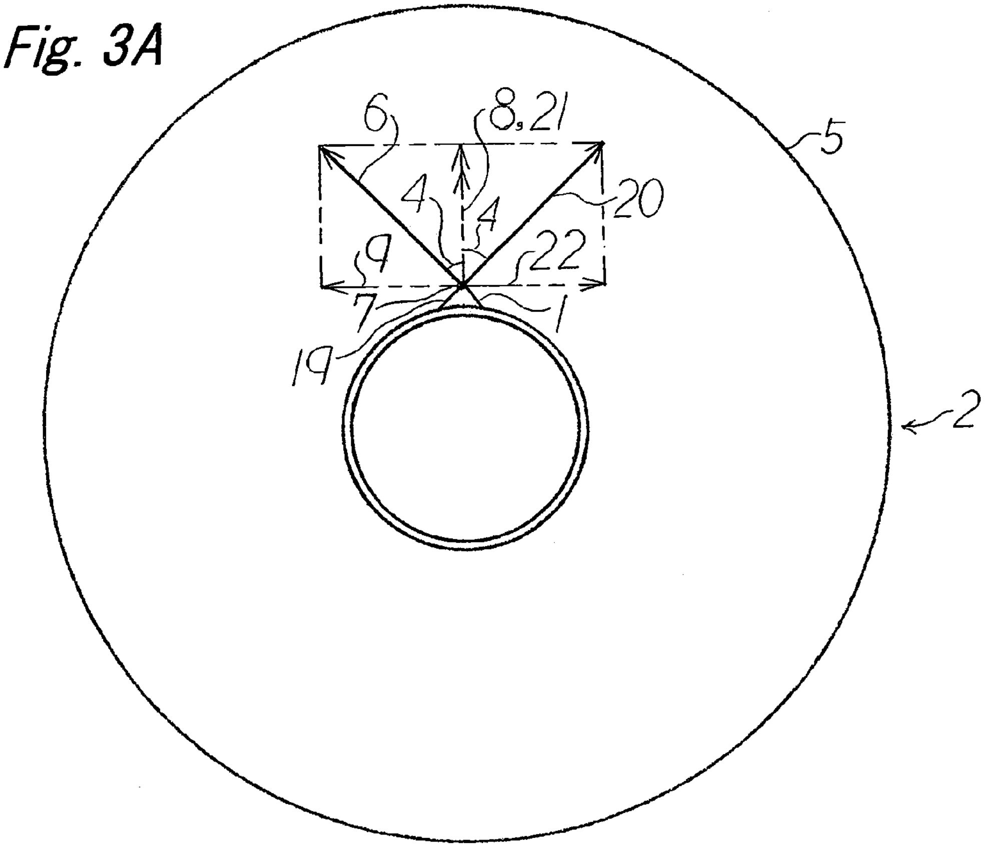
FIG. 3A shows a cone-type acoustic diaphragm with dual acoustic elements, illustrating the acoustic energy transmission of points on the diaphragm.

It is preferable to have a second layer of acoustic element 19 over laid on the first layer in an out-of-phase relationship to each other, likewise shown in FIG. 3A. Acoustic energy transmissions 6 and 20 of point 7 have double normal components 8 and 21, and double tangential components 9 and 22 in opposite directions. Opposite motion between cross-plied tangential components 9 and 22 is out-of-phase relative to each other, and therefore increases internal loss.

Figure 2B:
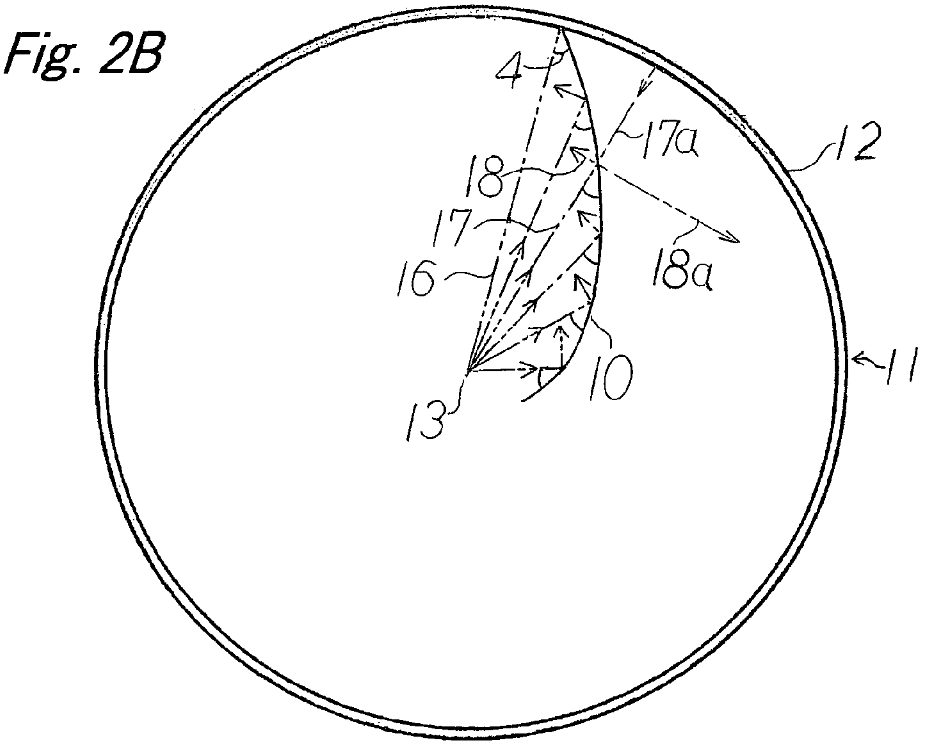
FIG. 2B shows a dome-type acoustic diaphragm with an acoustic element illustrating the reflections of the residual sound energies.

Referring to FIG. 2B, acoustic element 10 is supported by dome-shaped acoustic diaphragm 11, acoustic element 10 having a proximate end coupled to driver 12 and extending radially at acute angle 4 to normal 16, wherein a distal-end is spaced inwardly from driver 12 in the direction of acoustic diaphragm center 13. In FIG. 2B, residual sound energy 17 from center 13 is reflected in direction 18 by means of acoustic element 10 on acoustic diaphragm 11, and thus induces internal loss and attenuates standing waves. Residual sound energy 17*a* from driver 12 is reflected in direction 18*a* by means of acoustic element 10 on acoustic diaphragm 11, and thus induces internal loss and attenuates standing waves.

Figure 3B:
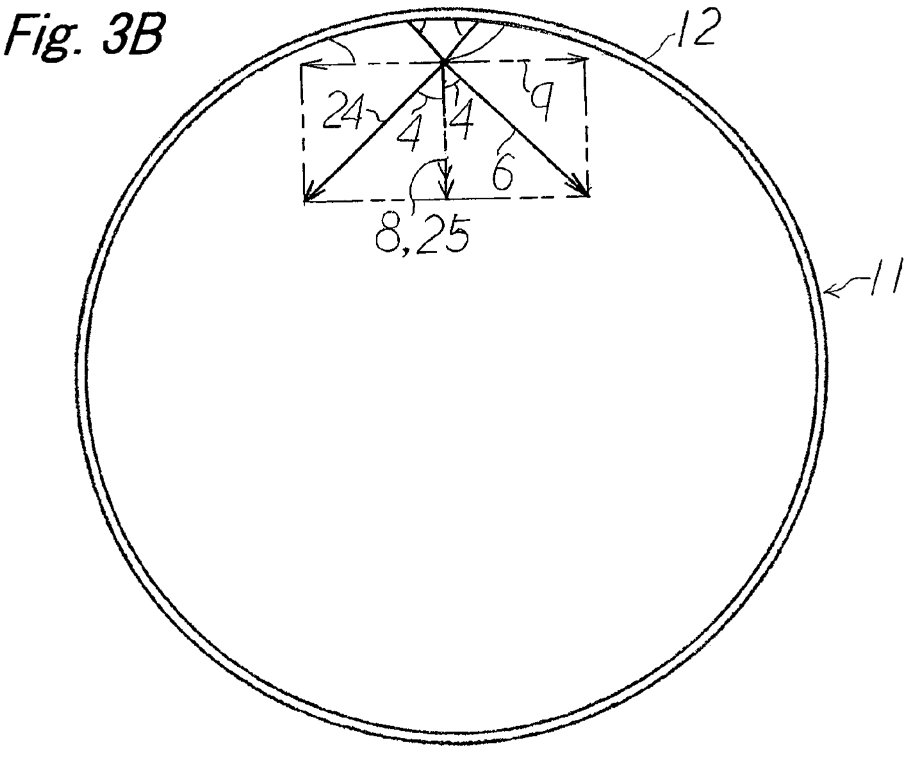
FIG. 3B shows dome-type acoustic diaphragm with dual acoustic elements, illustrating the acoustic energy transmission of points on the diaphragm.

It is preferable to have a second layer of acoustic element 23 over laid on the first layer, in an out-of-phase relationship to each other, likewise shown in FIG. 3B. Acoustic energy transmissions 6 and 24 of point 7 have double normal components 8 and 25, and double tangential components 9 and 26 in opposite directions. Opposite motion between cross-plied tangential components 9 and 26 is out-of-phase relative to each other, therefore increases internal loss.

Uniform acoustic energy distribution and attenuation for reflected acoustic waves are obtained when the acute angles of the acoustic element to each normal at the radius, and more preferably every radius, are substantially equal. Accordingly, in one preferred embodiment, an acoustic element has a curved portion or a bent portion fashioned in a logarithmic spiral.

When each layer of the above mentioned acute angle 4 is at 45-degrees, the result is a cross-angle of two acoustic elements of dual layers at 90-degrees. Layering of more than two layers is possible.

This invention is comprised of five structures as listed in Table 1.

TABLE 1

| Structures |
|---|
| a) composite, fiber reinforced plastic |
| b) supplemental |
| c) removal |
| d) mold |
| e) emboss |

In one embodiment of the invention, greatly increased performance over the prior art was achieved employing a fiber-reinforced plastic, (see Table 2-1(a)), using the "off-the-shelf" fibers of Table 3 as the acoustic element.

TABLE 2-1

| Fiber Reinforced Plastic Structures |
|---|
| a) fibrous material with matrix |
| b) fiber prepreg |
| c) mixed a) & b) |
| d) eardrum type [cutaneous-like layer - fiber layer - damping material] |

TABLE 3

| Materials |
|---|
| Existing acoustic diaphragms and materials can be used for this invention (e.g., "off-the-shelf"). Every material which stays on an acoustic diaphragm can be used as the acoustic element. |
| a) the fibers, [organic, inorganic] the super facultative fibers (e.g., carbon, aromatic-polyaramid, etc.) are well documented in the following texts: The World of New Fibers, (Nyu-senni no sekai) Tatsuya Hongu, Dr., Nikkankougyoushinbunsha, Tokyo, 1988, The World of High-Tech Fibers, (Haiteku-senni no sekai) Tatsuya Hongu, Dr., Nikkankougyoushinbunsha, Tokyo, 1999, each of which are hereby incorporated by reference. |
| b) yarn, tow, strand, prepreg, chip |
| c) foil, film, sheet, stripe, cloth, fabric, pulp, paper [organic, inorganic] [laminated] [Al, Al-alloy, Ti, Ti-alloy, Mg, Mg-alloy] |
| d) powder, flake, oblong [organic, inorganic] [Al, Al-alloy, Ti, Ti-alloy, Mg, Mg-alloy] ceramics, nano-carbon (tube, cup, horn, fullerene) |
| e) paint, lacquer, colors, marker-pen, ink, UV ink, pigment [Al, Al-alloy, Ti, Ti-alloy, mica, ceramics] |
| f) resin, thermosetting, UV-setting, thermoplastic: polypropylene, polyester, epoxy, phenolic, liquid crystal polymer (LCP) |
| g) adhesive with/without inclusion [organic, inorganic] |
| h) raw material for supplement evaporation [organic, inorganic] [Al, Al-alloy, Ti, Ti-alloy, Mg, Mg-alloy, ceramics, nano-carbon] |
| i) laminated, clad |
| j) ferromagnetic, powder, oblong, sheet for electro-magnetic system |
| k) piezoelectric [organic, inorganic] |
| l) electrostatic |

Figure 4A:
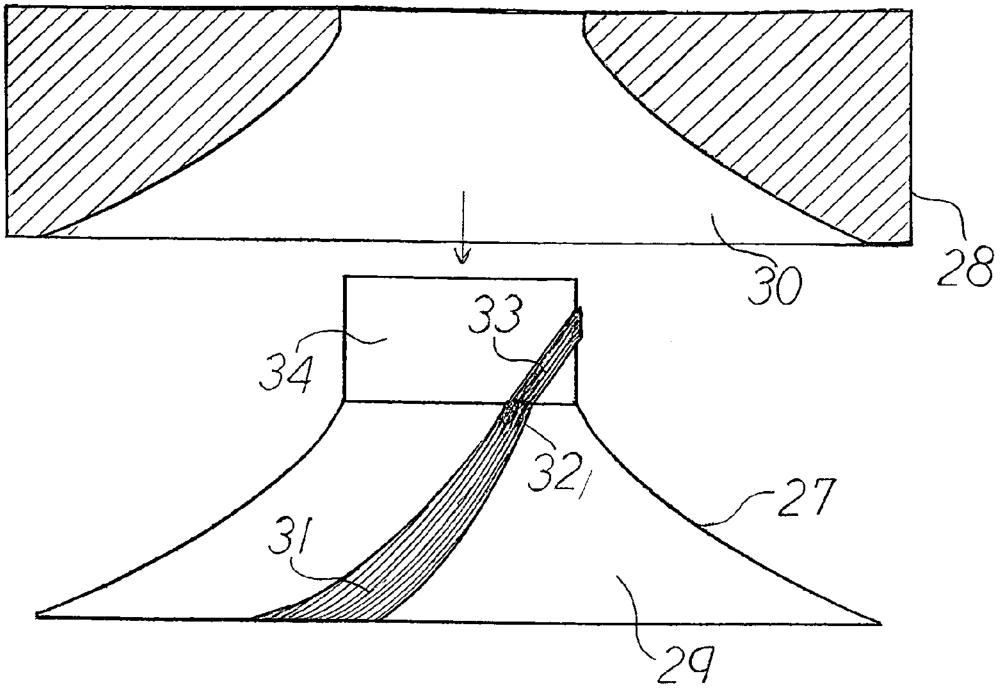
FIG. 4A shows a die for making a cone-type acoustic diaphragm with expanded fiber strands according to the invention.

A method for producing a cone-type acoustic diaphragm of the present invention may comprise the following stages:

(1) Provide convex die 27 and concave die 28, as shown in FIG. 4A, having non-adherable convex surface 29 and concave surface 30 using one of the preferable materials such as fluorocarbon polymers.

Figure 5A:
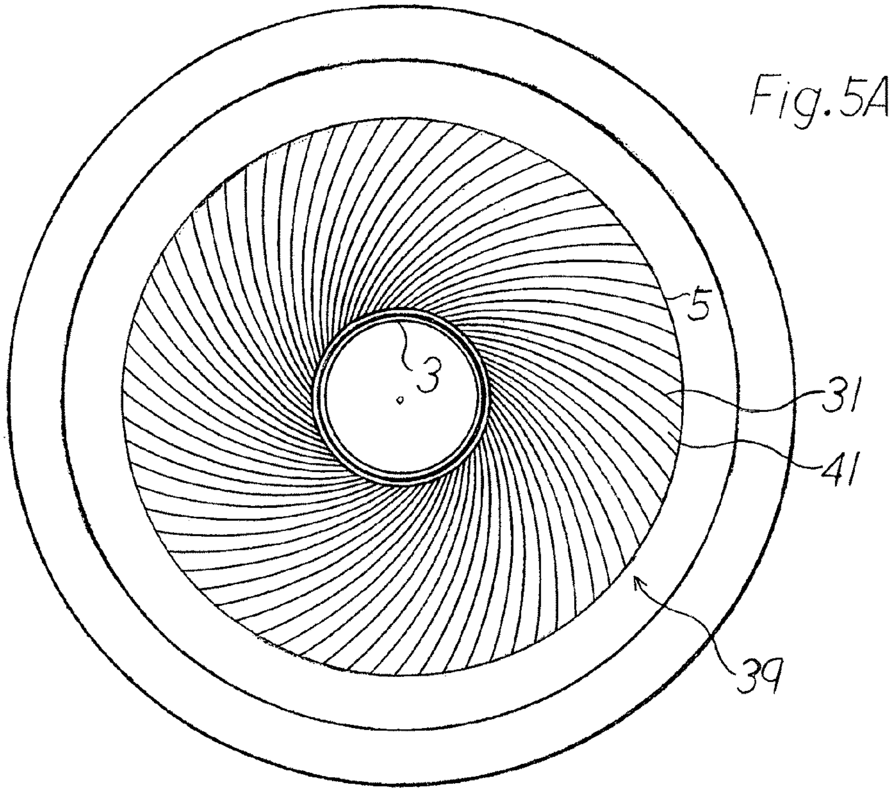
FIG. 5A shows the distribution of fibers for a single layer on the cone-type acoustic diaphragm according to the invention.

(2) For example, a carbon fiber with tensile strength of 360 kg-f/mm$^2$ and tensile elasticity of 24000 kg-f/mm$^2$ is used. In order to make conical acoustic diaphragm 39, as shown in FIG. 5A, with an outer diameter of 120 mm and an inner diameter of 33 mm, about thirty four strands of 100 mm long carbon fiber, consisting of 3000 fibers each, are prepared. It is preferable to cover the entire surface of the acoustic element such that it has an effective length longer than its effective radius.

(3) Convex surface 29 may then be coated using a cohesive epoxy resin.

(4) Carbon fiber strands 33 are arranged side-by-side in parallel and lapped around neck 34 by a fluorocarbon polymer tape. As shown in FIG. 4A, carbon fibers 31 having proximate end 32 are coupled to a driver and extend radially at an acute angle to the normal on a tangential plane of diaphragm surface in accordance with an increase of acoustic diaphragm radius. Since the volume of carbon fiber is substantially the same, the linear density of the acoustic element, carbon fiber, decreases in accordance with the diaphragm radius and thus the carbon fibers are distributed uniformly within every radius.

(5) Once all carbon fiber strands are in place covering the entire convex surface, an additional coating of epoxy-resin may be applied to the carbon fibers, if necessary. The epoxy resin thus composes a matrix.

Figure 8:
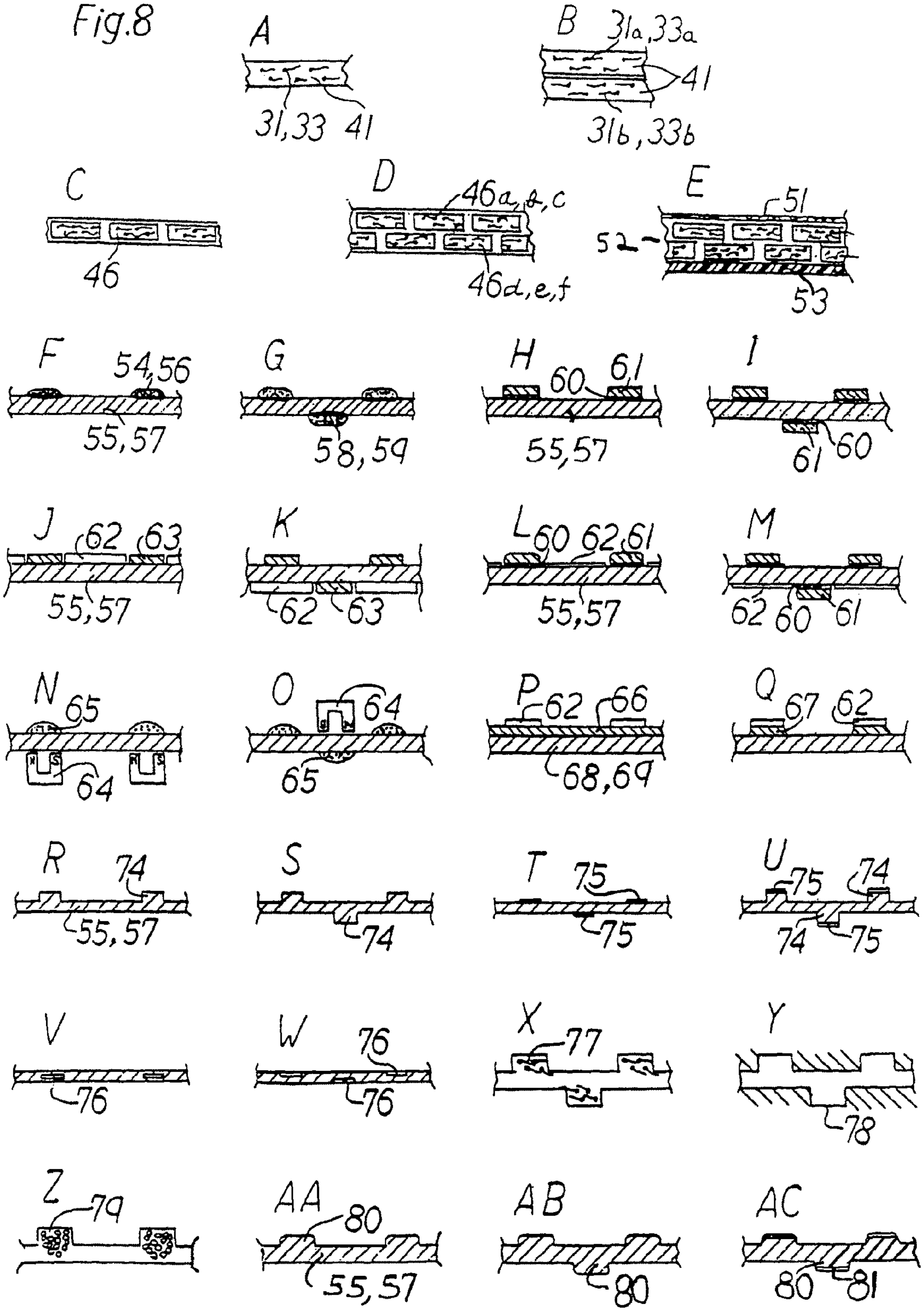
FIG. 8A to 8AC show the circular sectional views of the arrangement of acoustic element at the periphery of acoustic diaphragm according to the invention.

(6) Concave die 28 is applied over convex die 27, and then kept clamped for a specific time and at a specific temperature in order to cure. In a preferred embodiment a curing temperature of 120° C. for at least one (1) hour is used. A lower temperature epoxy resin may be used as well. After cool down, the acoustic diaphragm is removed from the dies. FIG. 5A shows a distribution of carbon fibers 31 on a cone-type acoustic diaphragm 39. A circular sectional view at the periphery is shown in FIG. 8A.

Figure 5B:
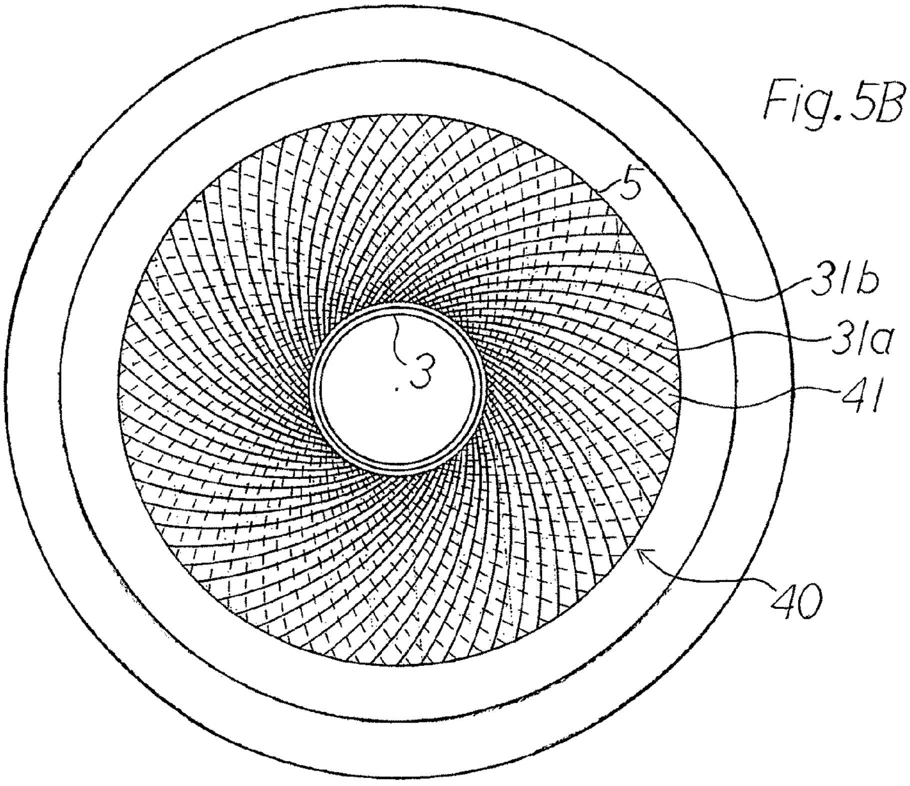
FIG. 5B shows the distribution of fibers for a dual layer on the cone-type acoustic diaphragm according to the invention.

(7) In one embodiment of the invention, additional counter-directional carbon fibers 31*b* may be applied, as shown in FIG. 5B. If necessary, a thin paper sheet or film cover may be added over the first carbon fiber layer 31*a*, originally applied in above stage (5), then the above mentioned procedures from stages (2) to (6) are repeated. FIG. 5B shows a distribution of carbon fiber layers 31*a* and 31*b* on cone-type acoustic diaphragm 40. A circular sectional view at the periphery is shown in FIG. 8B.

The acoustic diaphragm of the present invention may be understood to incorporate the advantageous characteristics of a human eardrum and a feather (refer to "Zemlin", "Nomura", "Harada", and "Nikkei" as seen in the following explanations.

For the cone-type acoustic diaphragm of FIGS. 5A and 5B, characteristics shared by the diaphragm and an eardrum and a feather are as follows:

(a) Acoustic elements 31, 31*a* and 31*b* of the diaphragm may be associated to an eardrum's fibers and a feather's twigs.

(b) Each element has a proximate end which is coupled to driver 3, as are an eardrum's malleus and a feather's bough.

(c) Each element extends radially at a uniform acute angle to normal of driver 3, as is a feather's twig, which extends from the bough at a uniform acute angle.

(d) Adequate internal loss is induced between the fiber and the matrix, as with an eardrum's fiber composition and a feather's twigs, with air as a matrix.

(e) In a dual layer construction, the direction of fibers in the first layer is out-of-phase relative to the direction of fibers of the second layer, as is the case with an eardrum's fibers and a feather's twigs.

(f) The acoustic element reduces standing waves reflected from the periphery and driver as with an eardrum's fibers and a feather's twigs.

(g) Regarding the required amount of fiber within adequate weight, the inventor has discovered in practice that an acoustic diaphragm having a weight/area ratio of up to three times, preferably twice, that of the human eardrum presents sufficient characteristics. The human eardrum weight/area ratio is 0.25 mg/mm$^2$ (14 mg/effective movable area (55 mm$^2$)), (refer to "Zemlin" and "Nomura"), hereinafter referred to as a "G/S ratio." Reduction of the G/S ratio increases an effective frequency bandwidth of an acoustic diaphragm.

Figure 4B:
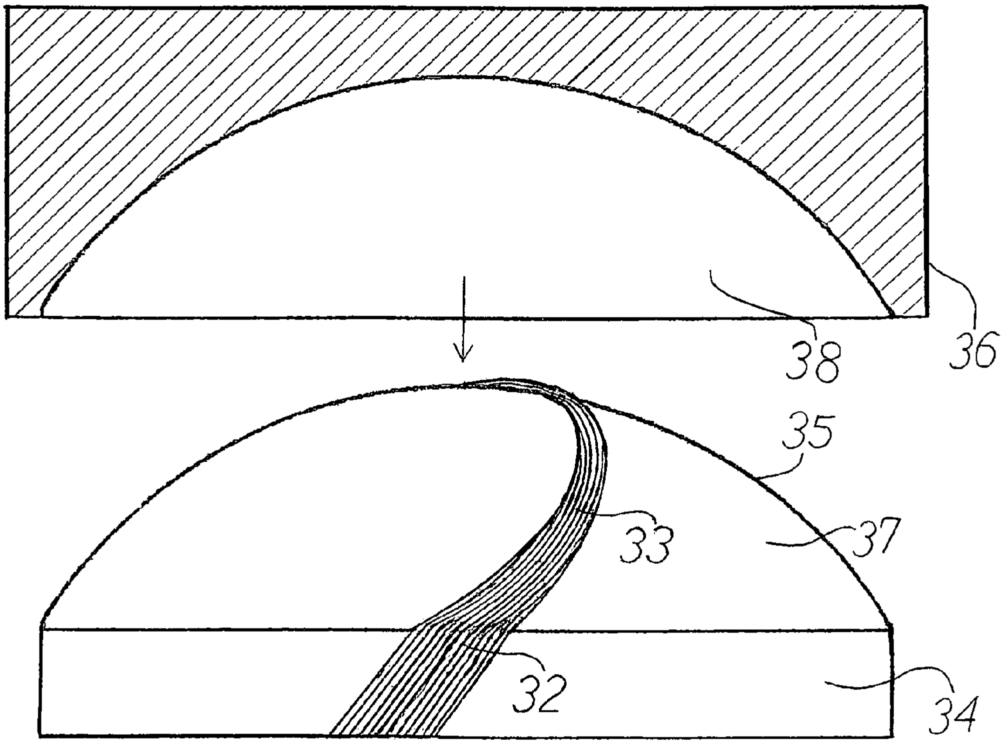
FIG. 4B shows a die for making a dome-type acoustic diaphragm with expanded fiber strands according to the invention.

A method for producing a dome-type acoustic diaphragm of the present invention may comprise the following stages:

(1) Convex die 35 and concave die 36 are illustrated in FIG. 4B. Convex surface 37 and concave surface 38 are non-adherable, preferably made of a material such as fluorocarbon polymers.

(2) For example, the carbon fiber of tensile strength of 360 kg-f/mm$^2$ and a tensile elasticity of 24000 kg-f/mm$^2$ may be used. In order to make dome-type acoustic diaphragm 42 of the FIG. 6A, carbon strand fiber 33 is prepared using 3000 strands in spread width of about 10 mm and shaped like a writing brush.

(3) Convex surface 37 and neck 34 are then coated using a cohesive epoxy resin.

(4) Carbon fiber strands 33 are arranged side-by-side in parallel and lapped around neck 34 by a fluorocarbon polymer tape. As shown in FIG. 4B, carbon fibers 33 have proximate end 32 coupled to a driver and extend radially at an acute angle to a normal on a tangential plane of diaphragm surface in accordance with decrease of a radius of acoustic diaphragm. The linear density of an acoustic element, carbon fiber, is substantially constant in accordance with a given radius, and thus the carbon fibers are distributed uniformly within every radius.

(5) Once all carbon fiber strands are applied to the entire convex surface, additional epoxy resin may be coated on the carbon fibers, if necessary. The epoxy resin then composes a matrix.

Figure 6A:
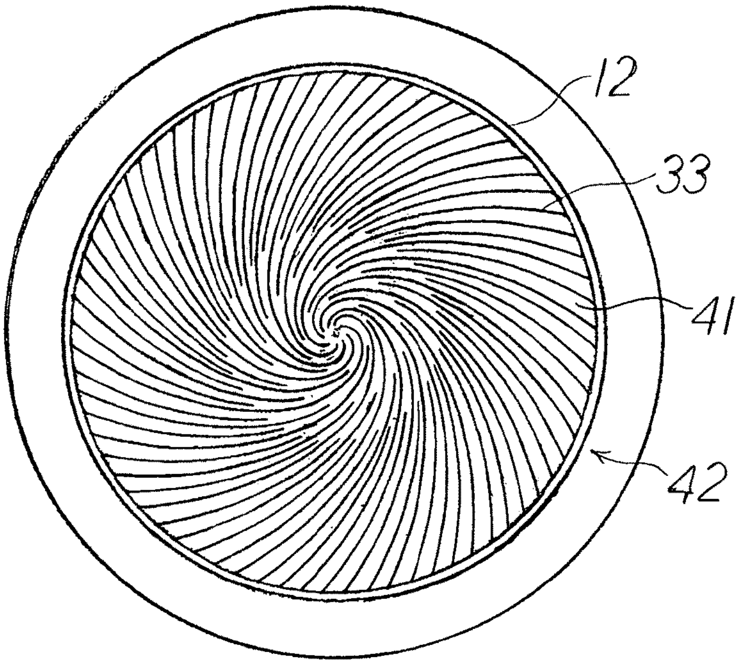
FIG. 6A shows the distribution of fibers for a single layer on the dome-type acoustic diaphragm according to the invention.

(6) Concave die 36 is applied over convex die 35 and is then kept clamped for a specific time and at a specific temperature to cure. In a preferred embodiment at a temperature of 100° C. for a minimum of one (1) hour may be used. After cool down the acoustic diaphragm is removed from the dies. FIG. 6A shows a distribution of carbon fibers 33 on dome-type acoustic diaphragm 42. A circular sectional view at periphery is shown in FIG. 8A.

Figure 6B:
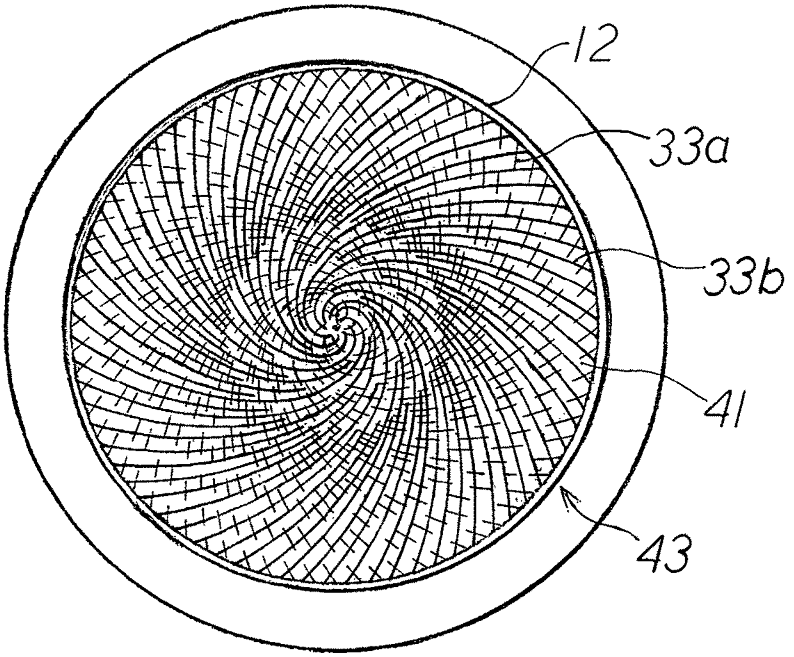
FIG. 6B shows the distribution of fibers for a dual layer on the dome-type acoustic diaphragm according to the invention.

(7) In one embodiment of the invention, additional counter-directional carbon fibers 33*b* may be applied as shown in FIG. 6B. If necessary, a thin paper sheet or film cover may be added over the first carbon fiber layer 33*a*, originally applied in above stage (5), then the above mentioned procedures from stages (2) to (6) are repeated. FIG. 6B shows a distribution of carbon fiber layers 33*a* and 33*b* on the dome-type acoustic diaphragm 43. A circular sectional view at periphery is shown in the FIG. 8B.

The acoustic diaphragm of the present invention may be understood to incorporate the advantageous characteristics of a human eardrum and a feather (refer to “Zemlin”, “Nomura”, “Harada”, and “Nikkei” as seen in the following explanations.

For the dome-type acoustic diaphragm of FIGS. 6A and 6B, characteristics shared by the diaphragm and an eardrum and a feather are as follows:

(a) Acoustic elements 33, 33*a* and 33*b* of the diaphragm may be associated to an eardrum’s fibers and a feather’s twigs.

(b) Each element has a proximate end which is coupled to driver 12 as are an eardrum’s malleus and feather’s bough.

(c) Each element extends radially at a uniform acute angle to normal of driver 12, as is a feather’s twig, which extends from the bough at a uniform acute angle.

(d) Adequate internal loss is induced between the fiber and the matrix, as with an eardrum’s fiber composition and a feather’s twigs, with air as a matrix.

(e) In a dual layer construction, the direction of fibers in the first layer is out-of-phase relative to the direction of fibers of the second layer, as is the case with an eardrum’s fibers and feather’s twigs.

(f) Reduction of standing wave reflected from a center and driver by an acoustic element (associated with an eardrum’s fibers and feather’s twigs).

(g) Regarding the required amount of fiber within adequate weight, the inventor has discovered in practice that an acoustic diaphragm having a G/S ratio of up to three times, preferably twice, that of human eardrum presents sufficient characteristics.

In the above described cone or dome type acoustic diaphragm, it is possible to use any kind of fiber listed in Table 3 in single or mixed mode. For example, an aromatic-polyaramid fiber is preferred when increase of internal loss and damping is required.

Figure 7A:
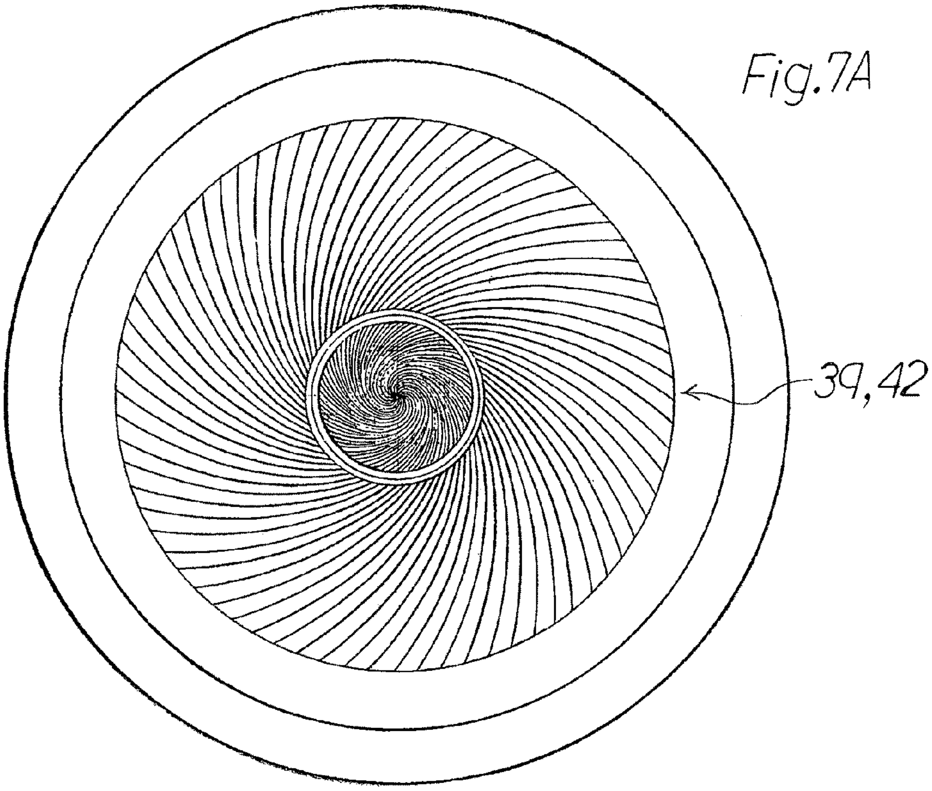
FIG. 7A shows the distribution of fibers for a single layer on the cone-and-dome-combined type acoustic diaphragm according to the invention.
Figure 7B:
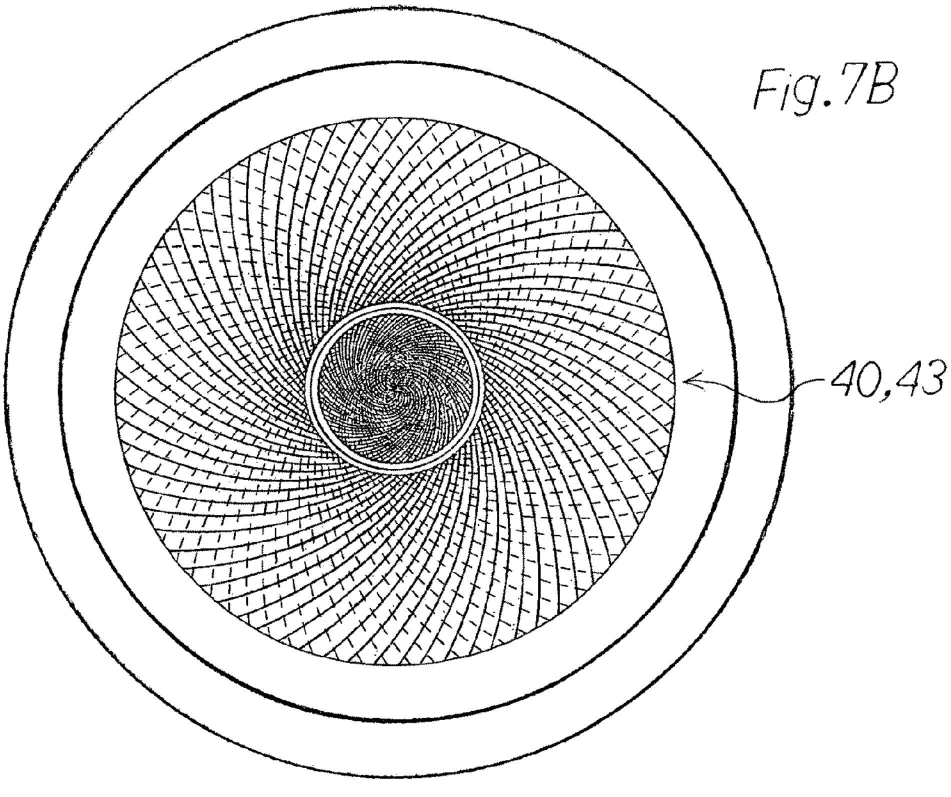
FIG. 7B shows the distribution of fibers for dual layer on the cone-and-dome-combined type acoustic diaphragm according to the invention.

In another embodiment of the invention, a combination of FIG. 5A cone-type acoustic diaphragm and FIG. 6A dome-type acoustic diaphragm produces FIG. 7A’s combination-type acoustic diaphragm. Further the combination of FIG. 5B cone-type and FIG. 6B dome-type provides FIG. 7B’s combination acoustic diaphragm, both of which show greatly increased performance over the prior art.

Thus, the acoustic diaphragm of the present invention utilizes an “off the shelf” fiber as an acoustic element. This represents a major advancement over any conventional acoustic diaphragm with the result of natural high-fidelity sound reproduction with wide frequency response, high efficiency and large dynamic range in real presence with high persistency and is weather proof.

Another embodiment of the invention greatly increases performance over the prior art using standard “off the shelf” unidirectional “carbon-fiber prepreg” (Table 2-1(b)) as an acoustic element. Cut out the carbon-fiber prepreg according to a specific size and shape of the required acoustic diaphragm is shown in FIG. 9.

In order to make the cone-type acoustic diaphragm of the present invention, perform the following steps:

(1) Convex surface 29 of FIG. 4A is covered by a thin paper, film, sheet or coating of cohesive epoxy resin or thermo-plastic.

Figure 9A:
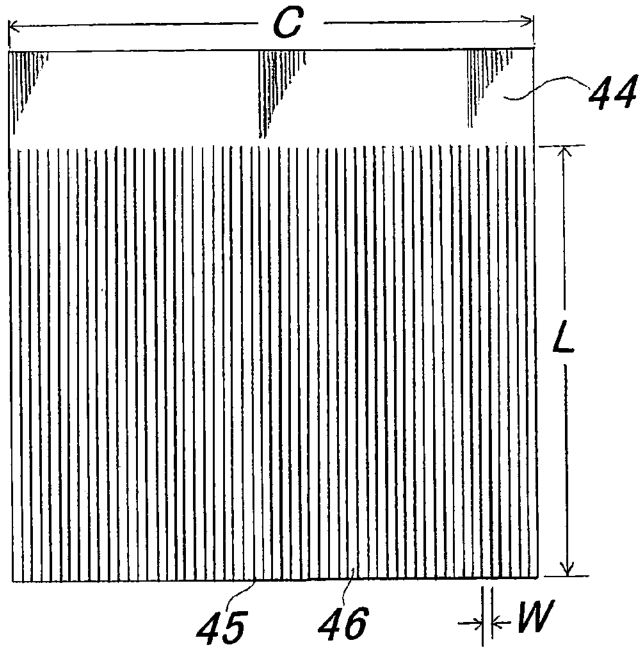
FIG. 9A to 9C show the cut sheets of unidirectional fiber for cone and dome type acoustic diaphragm according to the invention.
Figure 10A:
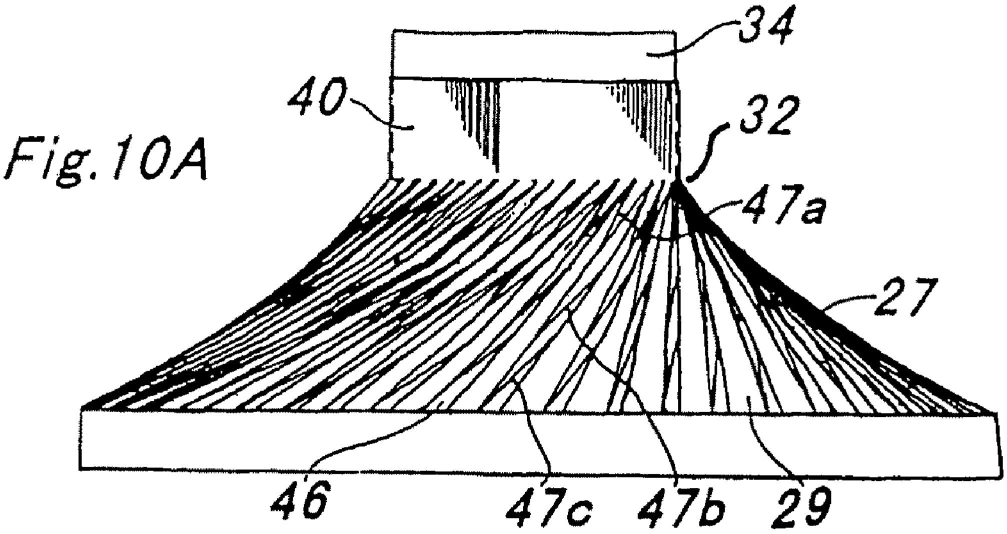
FIGS. 10A and 10B show the elevation view of the process for making an acoustic diaphragm using unidirectional fiber stripes according to the invention.
Figure 11:
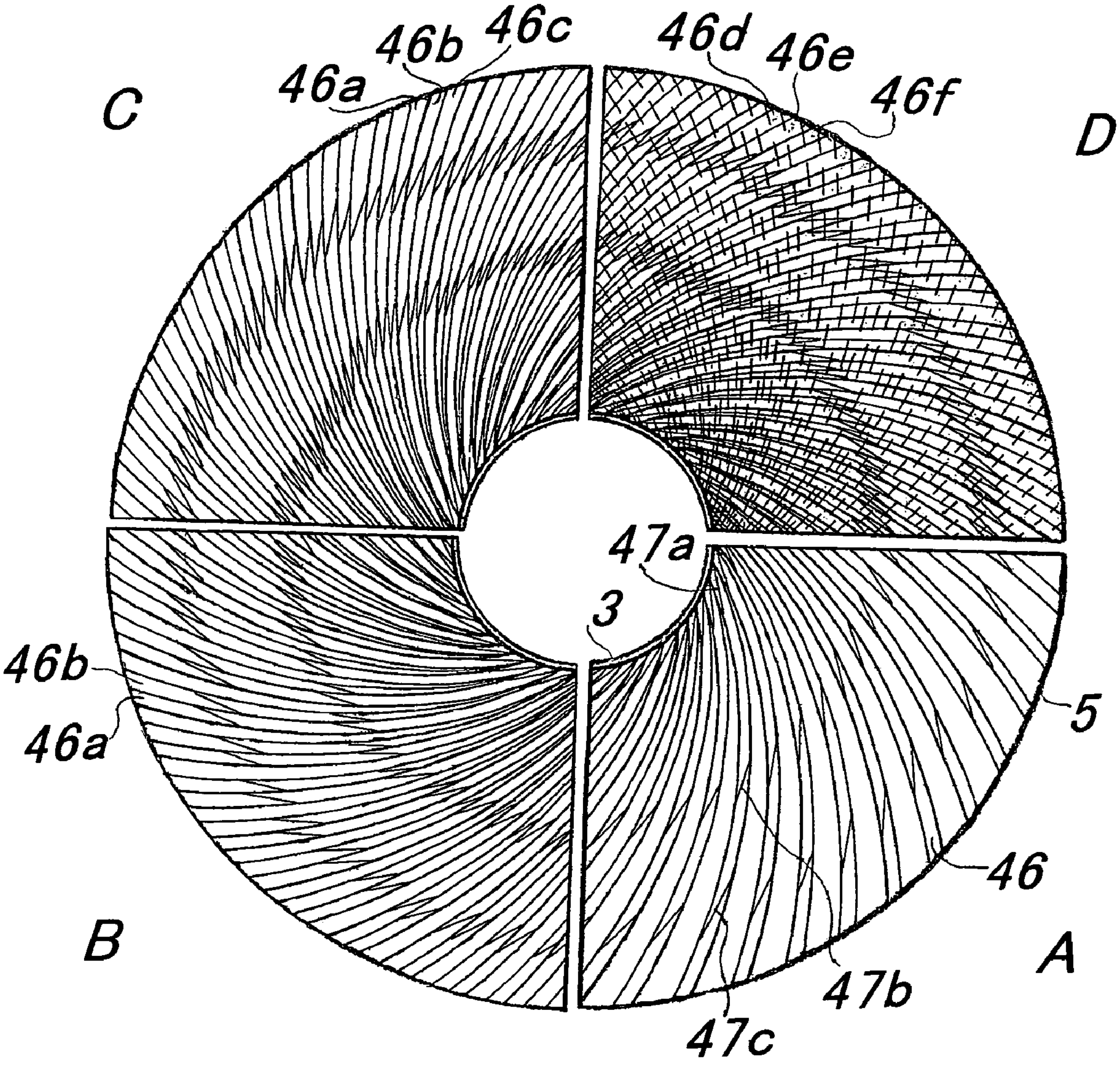
FIG. 11A to 11D show the plan view of the process for making cone type acoustic diaphragm using unidirectional fiber stripes according to the invention.

(2) Prepreg sheet 44 with slit 45 is shown in FIG. 9A. The un-slit area of the upper side (in the figure) is lapped around neck 34 of FIG. 10A by a fluorocarbon polymer tape. As shown in FIG. 10A and FIG. 11A, every carbon-fiber prepreg stripe 46, having proximate end 32, is coupled to driver 3 and extends radially at an acute angle by inverting at 47*a* to normal on tangential plane of the diaphragm surface and arranged in a predetermined line with the skid. Carbon-fiber prepreg stripe 46 is stuck on convex surface 29 using a hot tip such as soldering iron, for example. Further inversion of 47*b* and 47*c* are made if necessary.

Figure 10B:
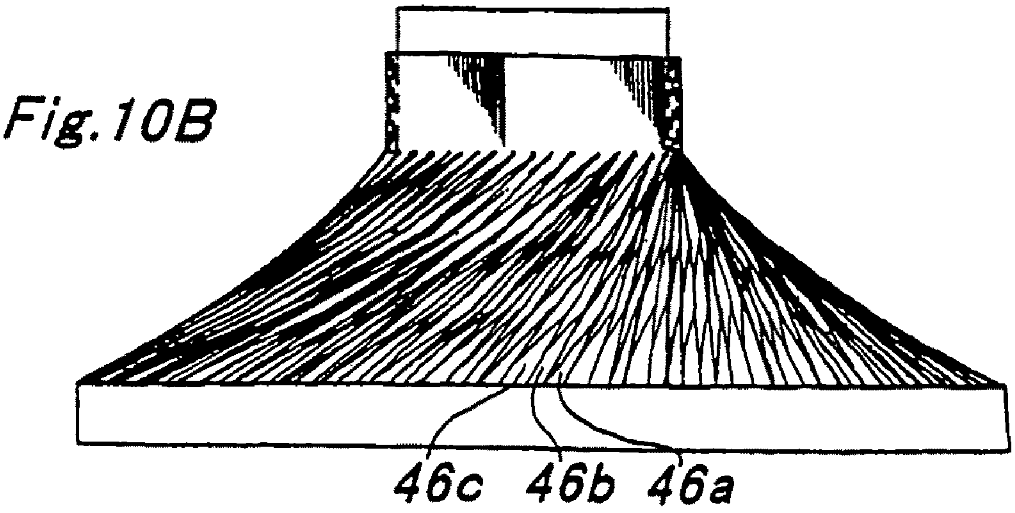

(3) Additional carbon-fiber prepreg layers 46*b* and 46*c* may be added onto the first layer as shown in FIGS. 10B, 11B and 11C. Optimum distribution of carbon-fiber prepreg stripes 46 at periphery 5 is obtained when a whole number of layers are applied. Thus, the ratio of outer-diameter and inner-diameter of a cone-type acoustic diaphragm is made ideal. For example, in case where the outer-diameter is 120 mm, and the inner-diameter is 33 mm, their ratio is 120/33=3.6. Thus, in this case three layers produces an optimum ratio.

(4) In order to make cross-plied layers, the additional of a layer in the opposite direction, as in layers 46*d*, 46*e*, and 46*f* are setup as shown in FIG. 11D.

(5) Then an additional epoxy resin coating is applied to the carbon-fiber prepreg.

(6) Concave die 28 of FIG. 4A is applied over convex die 27 of FIG. 10 and clamped, then kept to cure at specific temperature for a specific time. It is acceptable to cure the resin of prepreg and coating at 130° C. for 1.5 to 2 hours. The temperature for curing of the epoxy resin may be increased. Temperatures up to 180° C. have been tested for high temperature epoxy. After cool down, the acoustic diaphragm is removed from the die. A circular sectional view at the periphery is shown in FIG. 8C for a single layer set and in FIG. 8D for a dual layer set. As shown in FIG. 8D, stripes 46*a*, 46*b*, and 46*c* of the first layer are interlaced with second layer stripes 46*d*, 46*e*, and 46*f*.

(7) The present invention utilizes an aspect ratio that is length of stripe L to the width of stripe W of more than ten, preferably twenty. In one embodiment, the aspect ratio of the stripe is thirty five.

Figure 9B:
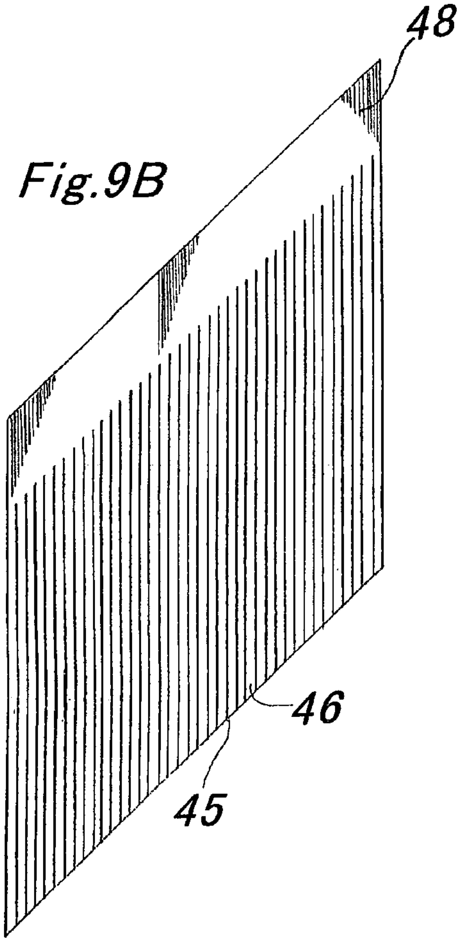

(8) In case of FIG. 9B, a sheet is used and the first inverting point 47*a* is eliminated.

(9) The embodiment of a cone-type acoustic diaphragm with 120 mm outer diameter and a 33 mm inner diameter is made of unidirectional carbon-fiber prepreg, 20 micron meter thick, standard composite physical specification of manufacture as shown in Table 5, with a bending strength of 180 kg/mm$^2$, bending elasticity of 15.5 T/mm$^2$, shearing strength between the layers of 9.5 kg/mm$^2$ for three layers overlaid in opposite directions (for a total six layers) shearing strength between the layers of 9.5 kg/mm$^2$, resulting weight 2.8 grams, less than twice that of G/S ratio=$[(120/2)^2\times\pi-(33/2)^2\times\pi\times 0.25\ (\text{G/S ratio})\times^2=5.2$ grams]. A cone-type diaphragm with a 300 mm outer diameter and a 100 mm inner diameter is made from a 50 μm thick prepreg, with a resulting weight of only 24 grams, which is less than twice that of its G/S ratio $[(300/2)^2\times\pi-(100/2)^2\times\pi\times 0.25\ (\text{G/S ratio})\times 2=31.4$ grams]. If the diaphragm is made from a 70 μm thick prepreg, then the resulting weight of 35 grams is still less than three times that of its G/S ratio.

TABLE 5

| Prepreg Standard Composite Physical Specification | | |
|---|---|---|
| Bending Strength | Bending Elasticity | Shearing Strength |
| 180 kg/mm$^2$ | 15.5 T/mm$^2$ | 9.5 kg/mm$^2$ |

In order to make a dome-type acoustic diaphragm of the present invention, perform the following steps:

(1) Convex surface 37 of the diaphragm of FIG. 4B is covered by a thin paper, film, sheet or coating of cohesive epoxy resin or thermoplastic.

Figure 9C:
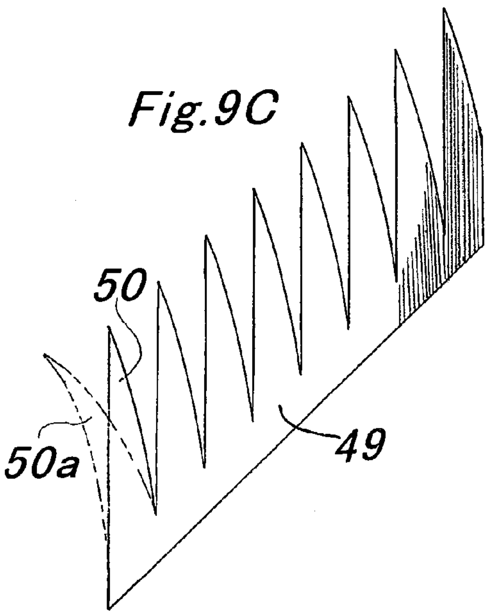

(2) As shown in FIG. 9C, prepreg sheet 49's un-slit area at the bottom of the figure is lapped around neck 34 using fluorocarbon polymer tape. As shown in FIGS. 4B and 9C, every carbon-fiber prepreg leaf 50 is deformed as in 50*a* and has proximate end 32 coupled to a driver which extends radially at an acute angle to normal on the tangential plane of the diaphragm surface and is arranged in a predetermined line. Carbon-fiber prepreg leaf 50*a* is stuck on convex surface 37 using a tip such as soldering iron.

(3) In order to make two layers or cross-plies, an additional layer is applied in the opposite directional.

(4) Then an additional epoxy resin coating is applied the carbon-fiber prepreg.

(5) Concave die 36 of FIG. 4B is applied over convex die 35 and then kept clamped for a specific time and at a specific temperature in order to cure. Times and temperatures for curing are discussed earlier in this specification. After cool down the acoustic diaphragm is removed from the die.

(6) The embodiment of a dome-type acoustic diaphragm with a 33 mm diameter is made with a 0.28 gram weight, less than twice that of the G/S ratio [$(33/2)^2 \times \pi \times 0.25$ (G/S ratio)$\times 2 = 0.43$ grams]

In the above mentioned cone or dome type acoustic diaphragms, it is possible to use any kind of prepreg utilizing the fibers listed in Table 3, or a mixture of them as in Table 2-1(c). An aromatic-polyaramid fiber is preferred when an increase internal loss and damping is required.

In the above description of fiber-oriented structures, it is possible to fix a fiber with a lateral adherable yarn, ribbon or tape, including heat-shrink type, without bending or weaving of the acoustic element for easy manufacturing.

As shown in FIG. 8E, the embodiment structurally identical with an eardrum (Table 2-1(d) and refer to "Zemlin") consists of three layers of tissue: thin paper or non-woven fabric 51 as a thin outer cutaneous layer, the fibrous middle layer 52 mentioned above, and the internal layer of polymer damping material coating 53 as a serous (mucous) membrane. Coating of a polymer damping material is able to be used anywhere in the invention.

In another embodiment of the invention, Supplemental Structures Table 2-2 shows greatly increased performance over the prior art and a further simplified fabrication process with reduced cost can be achieved using standard "off the shelf" materials listed in Table 3, or any kind of fixable material supplemented to the conventional acoustic diaphragm as an acoustic element.

TABLE 2-2

| Supplemental Structures |
|---|
| a) manual [writing-brush, dispenser] [direct, with adhesive] |
| b) printing, direct [silk screen], indirect [ink-jet, bubble-jet] [a mask may be provided on the matrix before supplement of the materials in mist or ionized mode] |
| c) metal sputtering in the air |
| d) evaporation, sputtering, CVD [thermal, plasma, microwave, ion-beam] in a vacuum |
| e) painting [splay, electrostatic] |
| f) plating [electrical, chemical] |
| g) adhesive plus [foil, sheet, ribbon, strip, chip, flake, powder] |
| h) ferromagnetic |

Figure 12A:
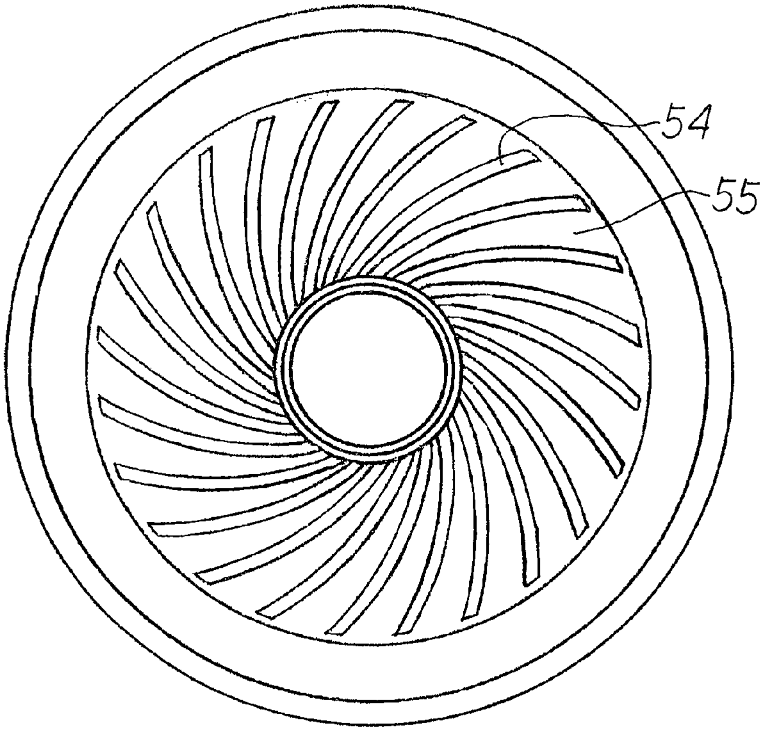
FIG. 12A to 12C show the plan view of the cone and dome type acoustic diaphragm with the supplemental acoustic element according to the invention.

In order to make an acoustic diaphragm of the present invention using standard "off-the-shelf" materials, perform the following steps:

a-1) As shown in FIG. 12A, a supplemental acoustic element 54 may be drawn manually on the conventional cone-type acoustic diaphragm 55 using paint, lacquer, colors, marker pen, ink or other pigment. A lacquer, such as gold, silver, black or any color with mica, aluminum or aluminum-alloy powder, flake, carbon material such as nano-carbon or ceramic, is preferable because of its relatively higher ratio of elasticity to density. A circular sectional view at the periphery is shown in FIG. 8F.

Figure 12B:
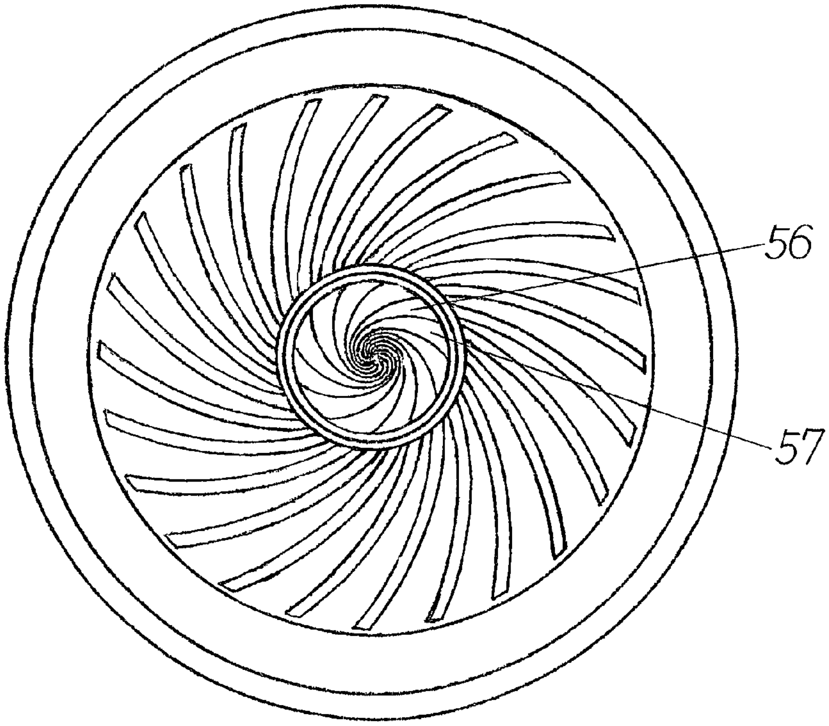
Figure 12C:
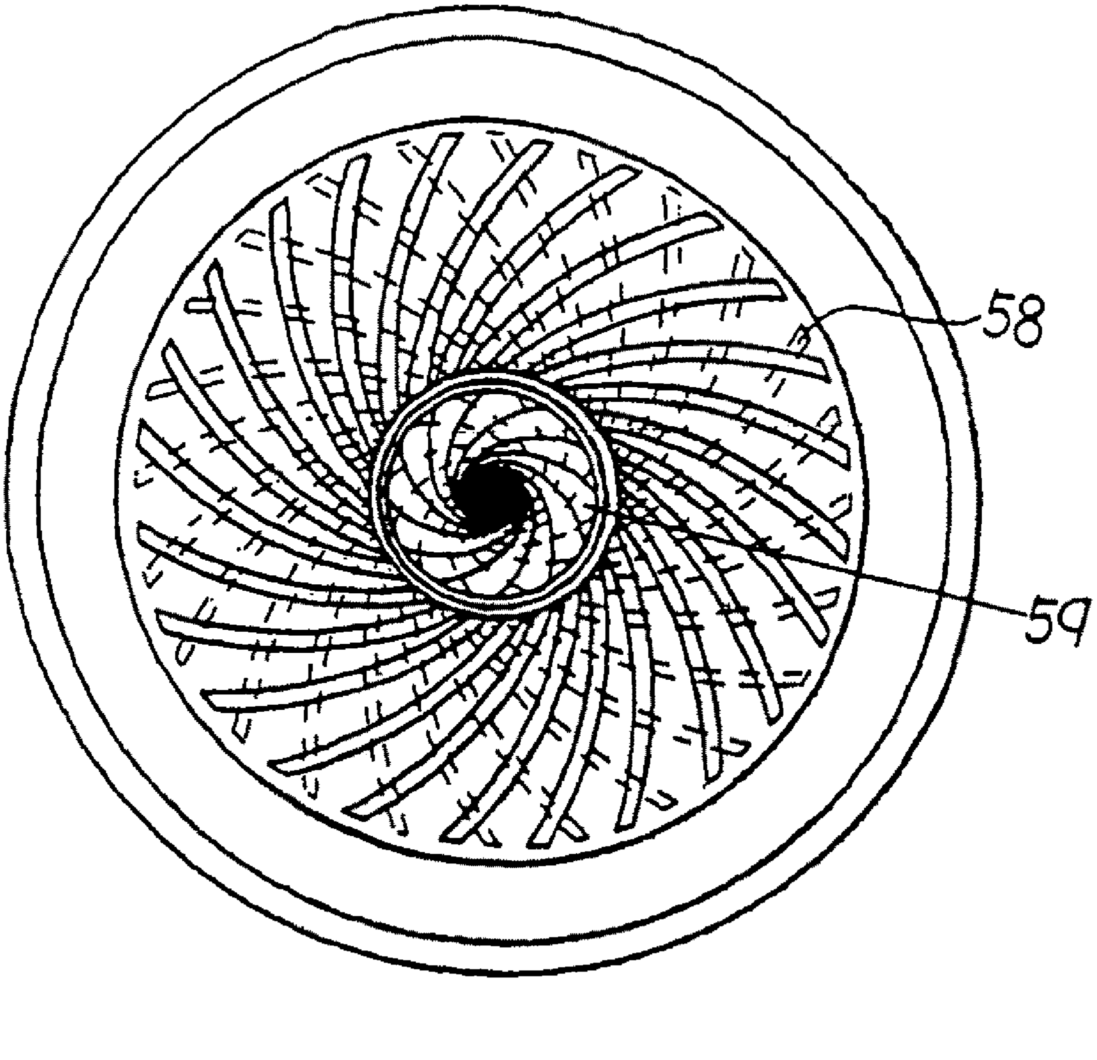
Figure 13A:
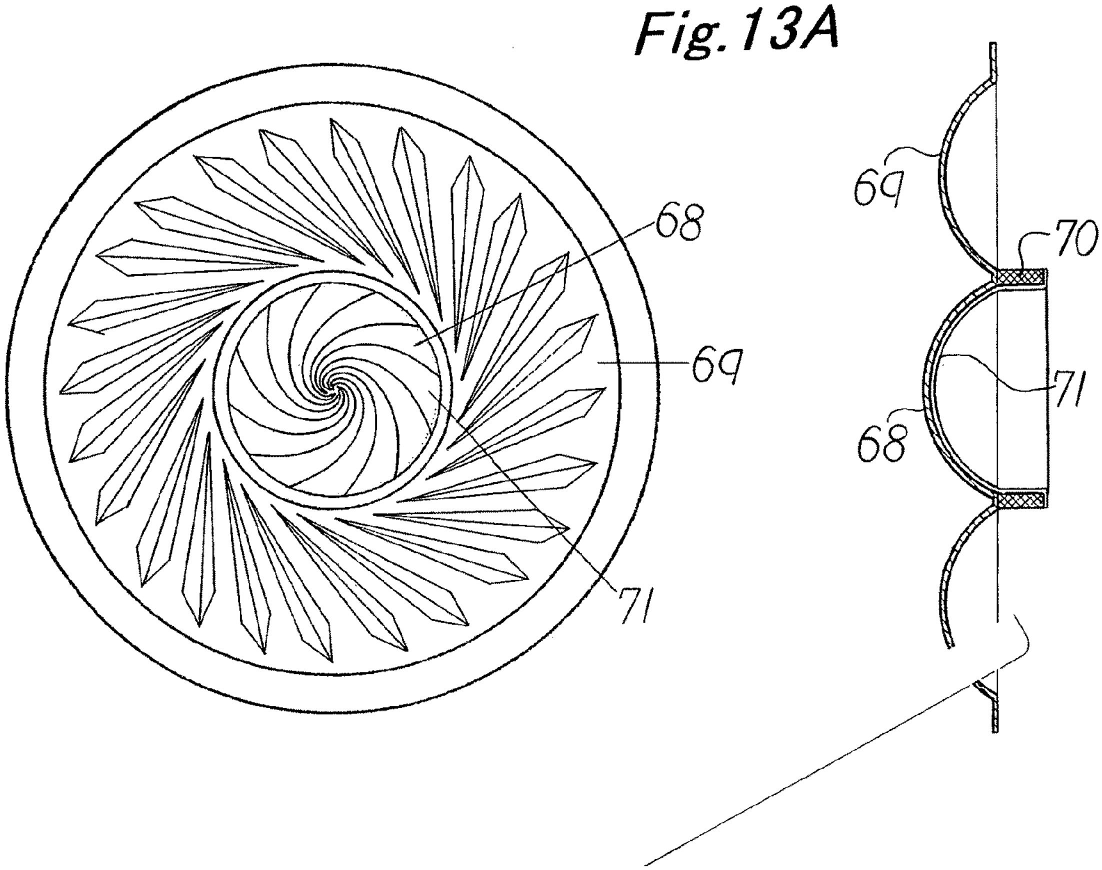
FIG. 13A to 13F show the plan view and the central sectional view of the dome-type acoustic diaphragm with annular concentric section and with supplemental acoustic element according to the invention.
Figure 13B:
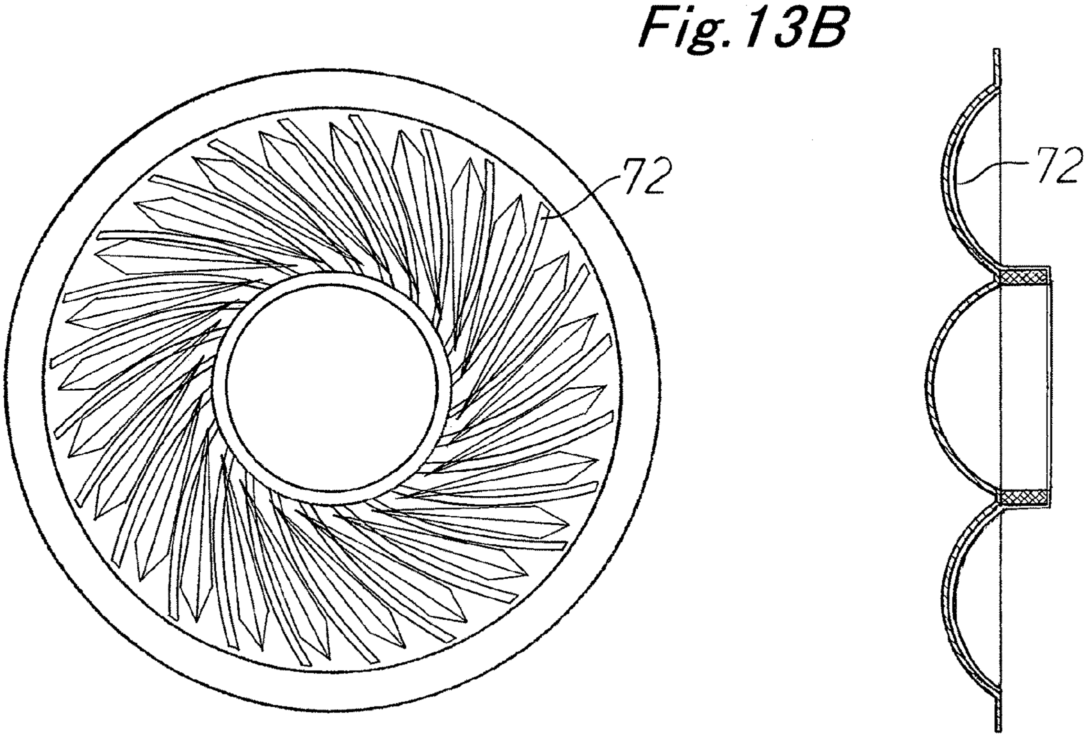
Figure 13C:
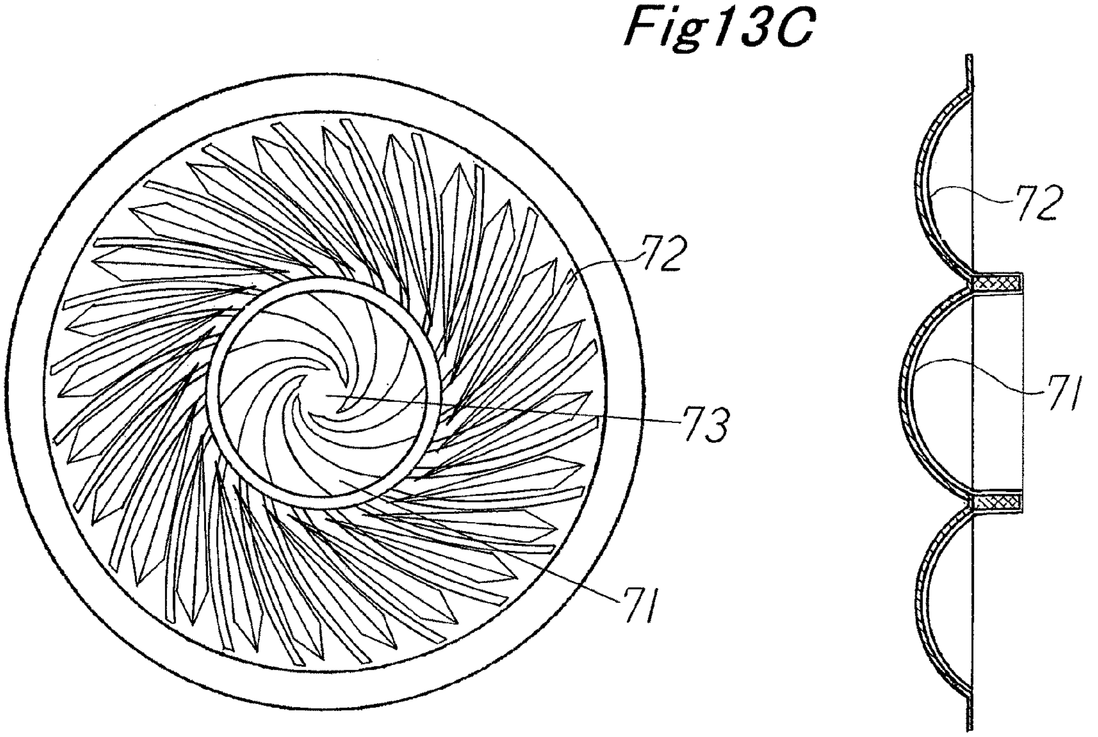
Figure 13D:
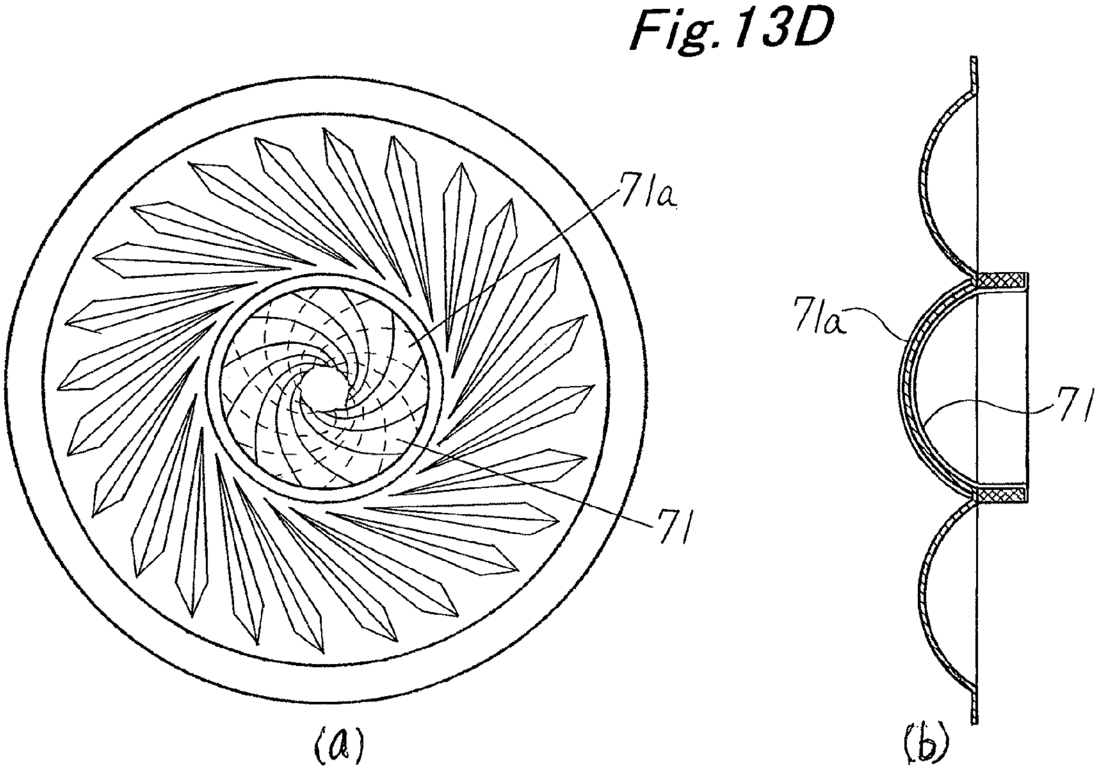
Figure 13E:
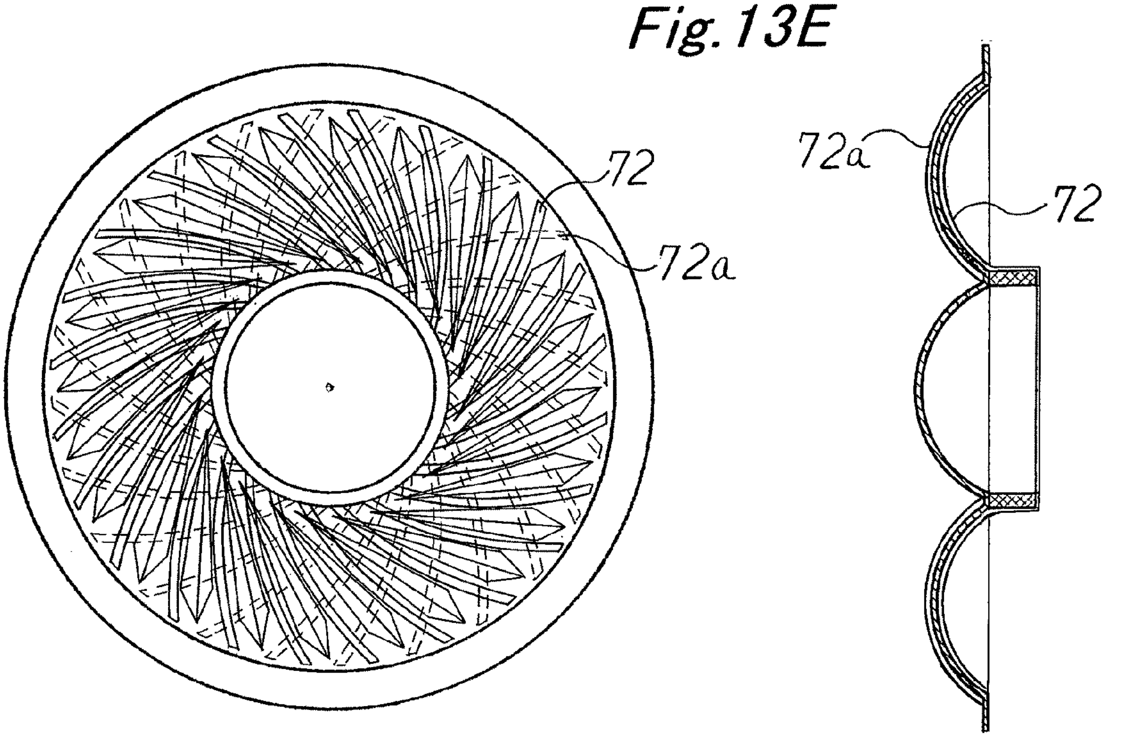
Figure 13F:
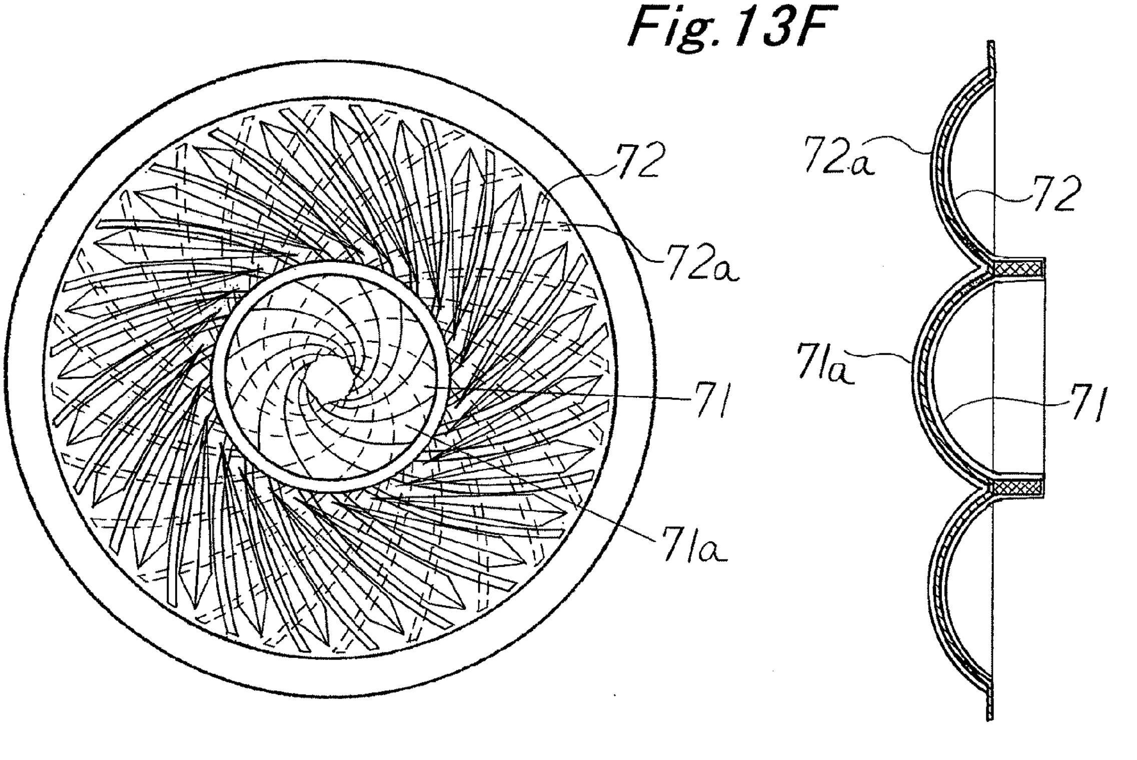

As shown in FIG. 12B, a supplemental acoustic element 56 may be drawn manually on the above described dome-type acoustic diaphragm 57 using paint, lacquer, colors, marker pen, ink or other pigment. A lacquer, such as gold, silver, black or any color with mica, aluminum or aluminum-alloy powder, flake, carbon material such as nano-carbon or ceramic, is preferable because of relatively high ratio of elasticity to density. A circular sectional view at the periphery is shown in FIG. 8F. FIG. 12C shows an additional opposite-directional acoustic element 58 or 59, provided on the other side of an acoustic diaphragm of the present invention. A circular sectional view at the periphery is shown in FIG. 8G. As shown in FIG. 8G, the additional opposite-directional acoustic element 58 or 59 are interlaced with the first acoustic element 54 or 56 at the periphery.

The 120 mm outer diameter and 33 mm inner diameter conventional pulp cone may be supplemented with an acoustic element of gold color lacquer, is made to within 3.5 grams, less than twice that of its G/S ratio weight. [G/S ratio weight$\times$2=5.2 grams].

The 33 mm outer diameter conventional pulp dome may be supplemented with an acoustic element of gold color lacquer, is made to within 0.21 grams, equal to the G/S ratio weight.

The 100 mm outer diameter conventional pulp dome may be supplemented with an acoustic element of gold color lacquer, is made to within 3.8 grams, less than twice of G/S ratio weight. [G/S ratio weight$\times$2=3.9 gram]

a-2) As shown in the FIGS. 8H and 8I, a supplemental acoustic element 61 may be created manually on one of the above described acoustic diaphragm embodiments using adhesive 60, such as epoxy resin, which is then covered it by acoustic element 61. A temperature of 25° C. for twelve (12) hours minimum is preferred for curing epoxy. The material of acoustic element 61 may be selected from Table 3.

b) Another alternative for creating an acoustic element is by printing using any direct printing method, such as silk screen, or indirect printing method, such as using an ink jet printer or a bubble jet printer. An acoustic element of 3 (three) microns width is possible when using an ink jet printing method.

As shown in FIG. 8J, a mask 62 is placed on the acoustic diaphragm 55 or 57, then the supplemental materials 63 are applied using techniques such as mist, or ionization, metal sputtering in the air, evaporation, sputtering, chemical vapor deposition (CVD) in a vacuum, painting and plating, as shown in the FIGS. 8J and 8K.

As shown in FIGS. 8L and M, adhesive 60 is also applicable to acoustic diaphragm 55 or 57 through mask 62, then acoustic element 61 is placed on adhesive 60.

As shown in the FIGS. 8N and 8O, a magnetic field by magnet 64 in accordance with acoustic element is placed behind acoustic diaphragm 55 or 57 and ferromagnetic materials 65 are aligned with the acoustic element. Then, ferromagnetic materials 65 is fixed to acoustic diaphragm 55 or 57 by an adhesive premixed or supplied thereon.

In a modified embodiment of the invention, Removal Structures Table 2-3, greatly increased performance over the prior art and further simplified fabrication and a reduced cost was achieved using standard "off the shelf" material, such as in Table 3, whereby removing unnecessary material from an acoustic diaphragm and remaining an acoustic element.

TABLE 2-3

| Removal Structures |
|---|
| Removable material overlaid or clad on the acoustic diaphragm and remaining acoustic element. |
| a) manual [A mask may be provided on the acoustic element of the acoustic diaphragm before removal using the methods below] |
| b) physical [sandblast, plasma, evaporation by energy-beam] |
| c) chemical [etching, electro-chemical etching] |

Detailed methods to achieve such improved performance are as follows:

FIG. 8P shows, another method of removing material 66 from an acoustic element laminated or clad on acoustic diaphragm 68 or 69. Mask 62 is created for the acoustic element material which is to remain, and the mask is placed over material 66, then unnecessary material is removed by a manual, physical or chemical method. The remaining acoustic element 67 is show in FIG. 8Q. The mask may remain on the acoustic diaphragm to better improve the acoustic characteristics of the diaphragm.

All supplemental and removal processes can be applied before or after the cone or dome shape is formed.

The desired space between the acoustic element parts should be made to be shorter than the wave length of the respective carrying frequency of the acoustic diaphragm.

FIG. 13 shows an acoustic diaphragm commonly used in a head-phone, an ear-phone and a dynamic microphone which is composed of dome 68, annular concentric section 69 with or without tangential wedge and the driver 70. FIG. 13A shows acoustic element 71 on the underside of dome-type acoustic diaphragm 68. FIG. 13B shows acoustic elements 72 on the underside of annular concentric section 69. An acoustic element is arranged along with a wedge as shown in FIG. 13B. This arrangement is preferable and it improves the lower frequency characteristics of the diaphragm. FIG. 13C shows an acoustic element 71 on the underside of domes 68 and 72 in annular concentric section 69. Center piece 73 is connected to the tips of acoustic element 71 and works as a secondary diaphragm for a higher frequency range. Even further improvements in performance are achieved by providing the opposite-directional acoustic element 71*a* on upper side of dome 68 as shown in FIGS. 13D(a) and 13D(b). Even further improvements in performance are achieved by providing the opposite-directional acoustic element 72*a* on the upper side of annular concentric section 69 as shown in FIG. 13E. Even further improvements in performance are achieved by providing the opposite-directional acoustic elements 71 and 72 on the upper side of dome 68 and annular concentric section 69 as shown in the FIG. 13F. The combination of FIG. 13B and FIG. 13D is also preferable.

In a modified embodiment of the invention, Mold Structures Table 2-4, greatly increased performance over the prior art and further simplified fabrication and reduced cost was achieved using standard "off-the-shelf" monolithic plastic material.

TABLE 2-4

| Mold Structures |
|---|
| a) molding |
| b) with external acoustic element |
| c) with internal acoustic element of ribbon, stripe, chip, or powder |
| d) with rectified flow: oblong, chip, pulp or liquid crystal polymer (LCP) |
| e) partial foaming |
| f) ferromagnetic |
| g) magnetic |
| h) laser modeling |
| a) FIGS. 8R and 8S show acoustic diaphragms with single-side and dual-side molded acoustic element 74. |
| b) FIGS. 8T and 8U show acoustic diaphragms with molded external acoustic element 75. |
| c) FIGS. 8V and 8W show acoustic diaphragms with molded internal acoustic element 76. |
| d) FIG. 8X shows the acoustic diaphragm processed with rectified flow of oblong, chip included, pulp or liquid-crystal-polymer (LCP) material by a twist die or a grooved die of FIG. 8Y for material flow control. These principles are also applied to the paper cone and dome acoustic diaphragm manufacturing of the present invention. Regarding LCP cast-crystal orientation, reference may be made to the Japanese Issued Patent 1924436. Regarding a LCP with chip or flake cast-crystal orientation reference may be made to the Japanese Issued Patent 1875159. |
| e) FIG. 8Z shows the acoustic diaphragm with foamed acoustic element 79. A speaker diaphragm made of molded foam resin is referred to in U.S. Patent Application Publication No.: US 2002/0027040 A1. |
| f) A ferromagnetic powder set in a polymer may be aligned as an acoustic element by using a magnetic field, as shown in FIG. 8N and 8O, provided the die is made of a non-magnetic material such as ceramic. |
| g) A magnetic powder set in a polymer may be aligned as acoustic element by using a ferromagnetic stripe, as shown in FIG. 12, provided that the die is made of a non-ferromagnetic material such as a ceramic. |
| h) Laser Molding is preferable for small size and pre-production embodiments of the present invention. |

In a modified embodiment of the invention, use of materials in Emboss Structures Table 2-5, greatly increased performance over the prior art and further simplified fabrication. Reduced cost was achieved using standard "off-the-shelf" materials listed in Table 3.

TABLE 2-5

| Emboss Structures |
|---|
| a) stamp, impress, indent: (heat or cold) |
| b) with supplement adhesion: |
| c) radiation energy scanning: [light, laser, x-ray] curing, reforming, (with rapid cooling) |
| a) As shown in FIG. 8AA and AB acoustic element 80 is embossed, stamped, impressed or indented under heat or cold condition onto acoustic diaphragm 55 or 57. |
| b) As shown in FIG. 8AC reinforce material 81, such as foil, film or sheet from Table 3 is adhered onto acoustic element 80. |
| c) Scanning a radiant energy (light, laser, ultraviolet (UV), X-Ray) beam on the appropriate acoustic diaphragm, following the diagrams of FIGS. 5 or 6, makes an acoustic element by curing or reforming. |

The acoustic element extends over the driver in a circular fashion, and it is preferably more than 20% of its width.

An acoustic element is also applicable to an acoustic diaphragm with concentric corrugation as well as a passive radiator and improves its characteristics.

In a preferred embodiment of the invention, in order to provide efficient transmission of acoustic energy, an acoustic element extends and couples with driver as in Table 4. Greatly increased performance over the prior art was achieved using the standard "off-the-shelf" materials of the Table 3 in this embodiment.

TABLE 4

Figure 14:
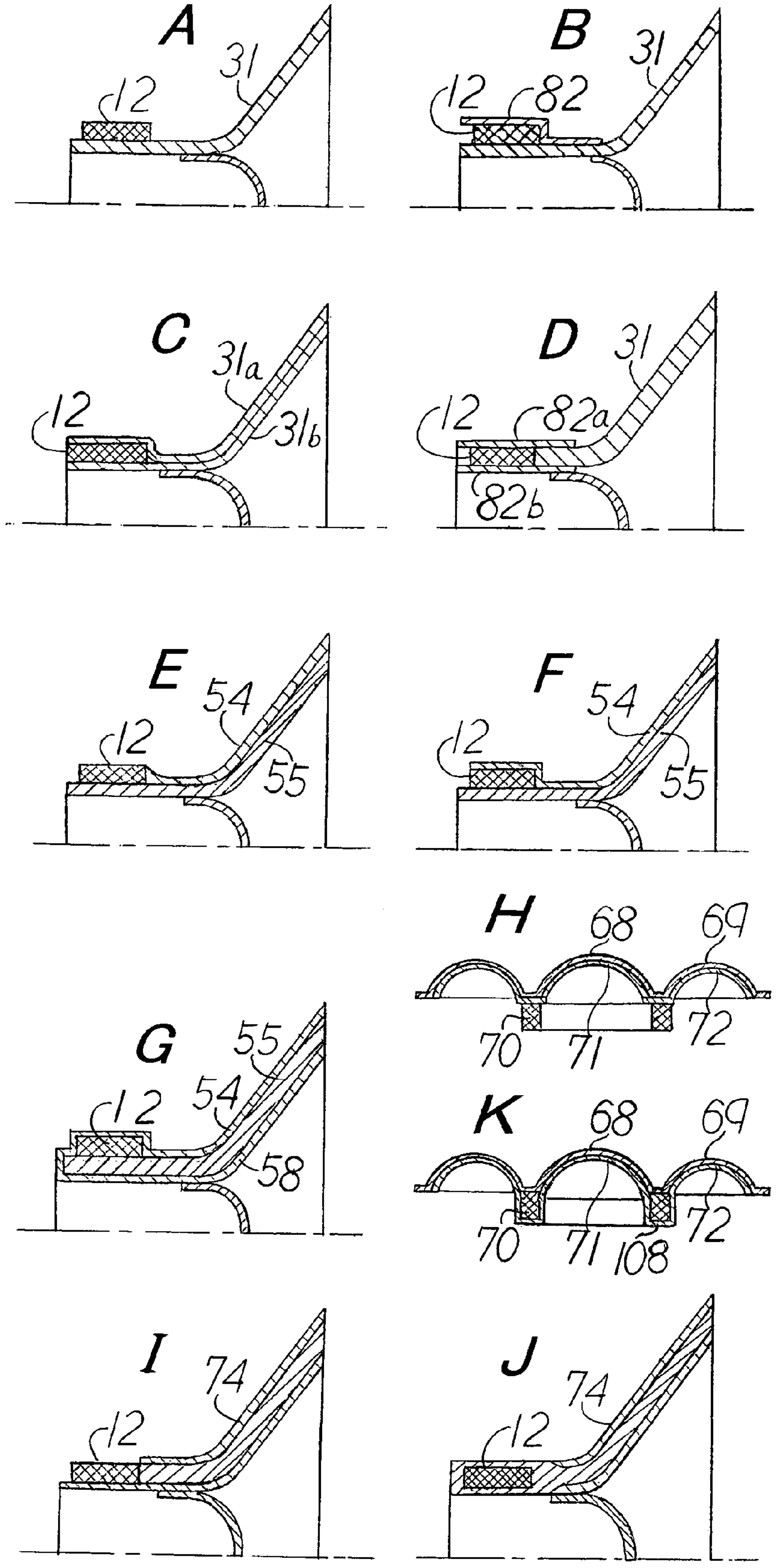
FIG. 14A to 14K show schematic diagrams of the acoustic element coupling to the driver according to the invention.

| An Acoustic element Coupling with Driver |
|---|
| a) One or more driver surface coupled with acoustic element |
| b) fiber reinforced plastic |
| c) supplemental |
| d) removal |
| e) mold |
| f) acoustic impedance matching |
| a) Generally, an acoustic element is coupled with one or more surfaces of a driver in order to provide the novel characteristics of the present invention. |
| b) In the fiber reinforced plastic structures, the fiber is coupled with one or more surface of the driver, such as a moving coil. FIG. 14A shows fiber 31 is coupled with one surface of driver 12. FIG. 14B shows fiber 31 and additional fiber 82 coupled with two or three surfaces of driver 12. FIG. 14C shows dual layer of fiber 31a and 31b, each coupled with two or three surfaces of driver 12. FIG. 14D shows two additional fibers 82a and 82b, sandwiching driver 12, as well as fiber 31. Consequently, substantial coupling is made within three surfaces of driver 12. |
| c) In the supplemental structure, acoustic element 54 is coupled with one or more surfaces of driver 12 as shown in FIG. 14E, 14F and 14G. Acoustic elements 71 and 72 are coupled with driver 70 for dome 68 with annular concentric section 69 are shown in FIG. 14H and previous FIG. 13A to F and their respective descriptions. Simultaneous supplementation of acoustic element 71 to dome 68 and 72, to annular concentric section 69 and 108, and to driver 70, as shown in FIG. 14K, provides superior results. |
| d) In the removal structures acoustic element 71 and 72 are coupled with one surface of driver 70 as shown also in FIG. 14H. |
| e) In a mold structure, acoustic element 74 is coupled with two or more surfaces of driver as shown in FIG. 14I and J. |
| f) In the invention, an acoustic impedance matching between acoustic elements and driver is important because of the high efficiency uniform acoustic energy transmission and high internal damping characteristics provided by an acoustic element. Experimental hearing test results indicate that an acoustic impedance matching represented by transmissivity should be more than 55% or 70% preferably. Transmissivity is well documented in the text, The Ultrasonic Engineering (Chouonpa Kougaku), p. 17, Seiken Shimakawa, Dr., Kougyo Chousakai Publishing Co., Ltd., 1977, Japan, which is hereby incorporated by reference. |

Figure 15:
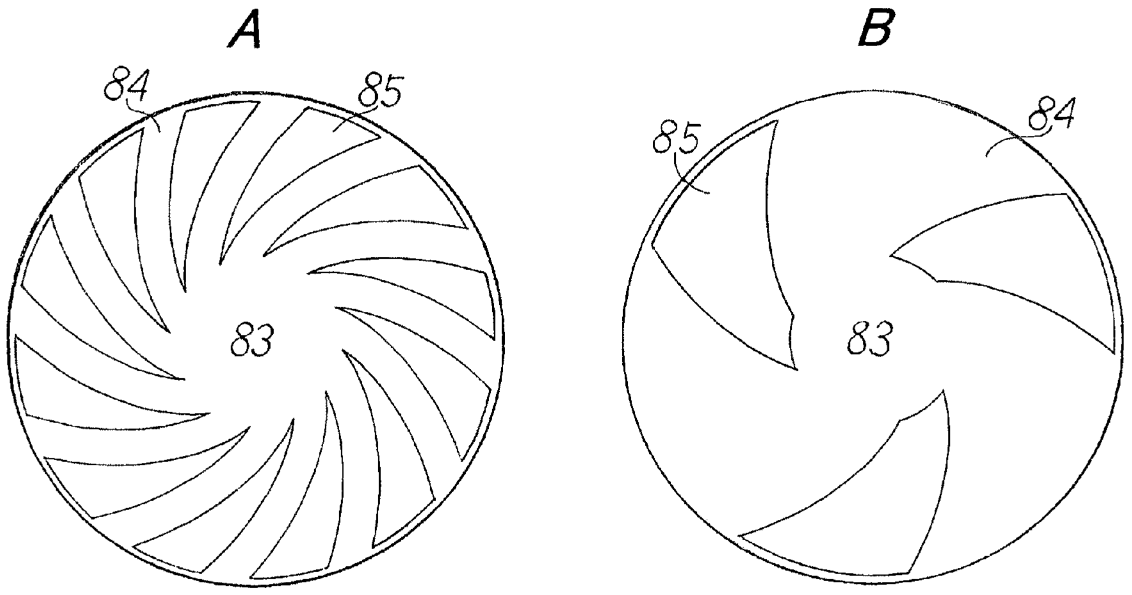
FIGS. 15A and 15B show the plan view of the plane drive acoustic diaphragm according to the invention.

In a modified embodiment of the invention greatly increased performance over the prior art was achieved using standard ferromagnetic material as an acoustic diaphragm of plane drive electro-magnetic system, such as telephone, earphone and hearing-aid, is shown in FIG. 15A. It is composed of a ferromagnetic film or sheet for central driving-area 83 and acoustic element 84 laminated with matrix 85. FIG. 15B shows the ferromagnetic acoustic diaphragm wherein a thickness of acoustic element 84 is reduced with respect of a radius.

For a piezoelectric material, or electrostatic material, FIG. 15A is also applicable.

In order to provide stable reciprocal motion of the driver, referring to the well-known "tripod" principle, three or more acoustic elements are necessary.

Figure 16:
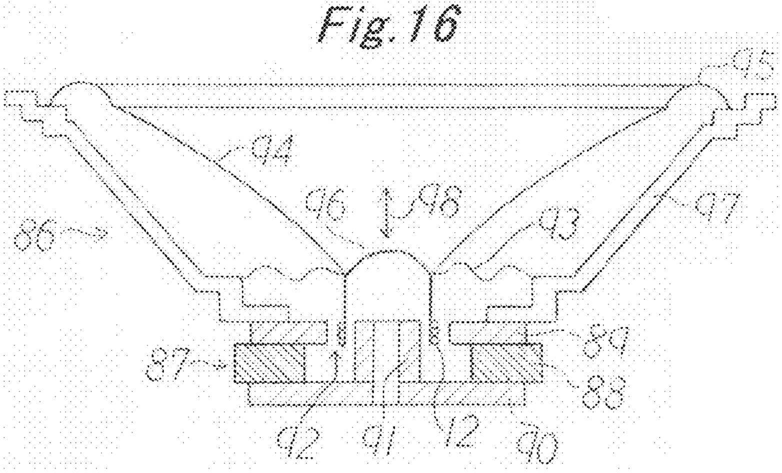
FIG. 16 shows a central sectional view of a loudspeaker according to the invention.

FIG. 16 shows a side cross-section of a common dynamic moving coil conical loudspeaker system 86. Voice coil 12 carries a varying current applied from an external source, such as, for example, an audio system (not shown). Loudspeaker system 86 is constructed so that voice coil 12 is positioned within a constant magnetic field formed by a field structure 87. A typical field structure 87 includes permanent magnet 88 coupled to front plate 89 and back plate 90. Pole piece 91 forms gap 92 between it and a front plate 89. Voice coil 12 is positioned within gap 92. Back plate 90, front plate 89, and pole pieces 91 are generally made of a highly permeable material such as iron, which provides a path for the magnetic field of the magnet 88. Magnet 88 is typically made of ceramic/ferrite material and ring-shaped. An intense and constant magnetic field is formed in gap 92, where the magnetic circuit is completed. Voice coil 12 is movably supported by a first "inner" or "lower" suspension system 93, and is coupled to conical diaphragm 94 wherein an acoustic element is provided. Lower suspension system 93 is also commonly referred to as the "corrugation damper." Conical diaphragm 94 is supported at its periphery by a second "outer" or "upper" suspension system 95. Upper suspension 95 is also commonly called an "edge." Center cap 96 is provided not only as a higher frequency radiator but also as a dust cap. Field structure 87, the corrugation damper 93, and edge 95 are connected to and supported by an appropriate frame structure 97.

In typical operation, when a current is applied to voice coil 12, a corresponding electromagnetic field is produced at a right angle to the flow of current and to the permanent magnetic field in gap 92, causing a mechanical force that drives voice coil system 12, and correspondingly the conical diaphragm 94, in a reciprocating piston-like motion indicated by arrow 98. More specifically, the audio signal applied to voice coil 12 is typically an alternating current in the form of a sine wave of varying frequency. The flow in voice coil 12 of current in one direction on the positive half of the alternating cycle will cause a magnetic field of polarity and will result in motion of voice coil 12 and attached diaphragm 94 in a first (e.g., outward) direction. When the current through voice coil 12 reverses on the negative half the cycle, the polarity of the magnetic field generated by the voice coil 12 reverses, and the motion of voice coil 12 and diaphragm 94 like wise reverses (e.g., inward). Thus, voice coil 12 and attached conical diaphragm 94 are caused to move in a piston-like motion at frequencies corresponding to the frequency of the alternating current input to voice coil 12.

Figure 17:
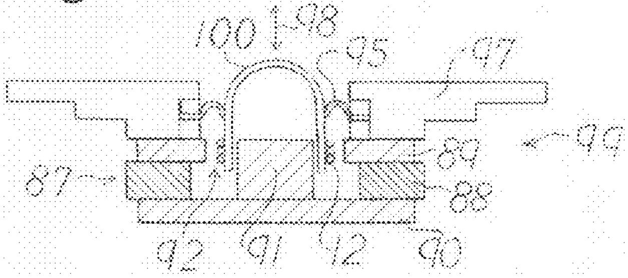
FIG. 17 shows a central sectional view of a dome-type speaker according to the invention.

FIG. 17 shows a side cross-section of a common dynamic moving coil dome speaker system 99. Voice coil 12 carries a varying current applied from an external source, such as, for example, an audio system (not shown). Dome speaker system 99 is constructed so that voice coil 12 is positioned within a constant magnetic field formed by field structure 87. A typical field structure 87 includes permanent magnet 88 coupled to front plate 89 and back plate 90. Pole piece 91 forms gap 92 between it and front plate 89. Voice coil 12 is positioned within gap 92. Back plate 90, front plate 89, and pole piece 91 are generally made of a highly permeable material such as iron, which provides a path for the magnetic field of the magnet 88. Magnet 88 is typically made of ceramic-ferrite material and ring-shaped. An intense and constant magnetic field is formed in gap 92, where the magnetic circuit is completed. Voice coil 12 is movably supported and coupled to dome diaphragm 100 wherein an acoustic element is provided. Dome diaphragm 100 is supported at its periphery by outer suspension system 95. Outer suspension system 95 is also commonly called a "edge". Field structure 87 and edge 95 are connected to and supported by an appropriate frame structure 97. A typical operation of a dome speaker is similar to the above mentioned conical loudspeaker.

Figure 18:
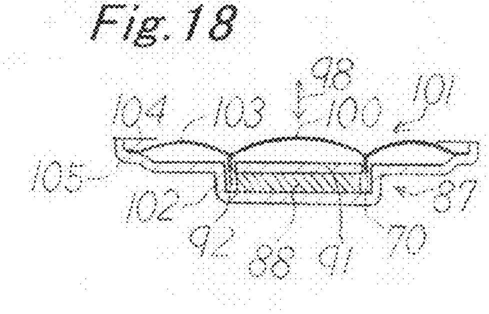
FIG. 18 shows a central sectional view of a dome-type earphone with annular concentric section according to the invention.

FIG. 18 shows a side cross-section of a common dome with annular concentric section system 101 for a head phone, earphone and microphone. Voice coil 70 carries a varying current applied from an external source, such as, for example, an audio system (not shown). System 101 is constructed so that voice coil 70 is positioned within a constant magnetic field formed by field structure 87. A typical field structure 87 includes permanent magnet 88 coupled to pole piece 91 and back basket 102. Pole piece 91 forms gap 92 between it and back basket 102. Voice coil 70 is positioned within gap 92. Basket 102, and pole piece 91 are generally made of a highly permeable material such as iron, which provides a path for the magnetic field of Magnet 88. Magnet 88 is typically made of rare earth permanent magnet. An intense and constant magnetic field is formed in gap 92, where the magnetic circuit is completed. Voice coil 70 is movably supported and coupled to a diaphragm composed of dome 100 and annular concentric section 103, wherein an acoustic element is provided. Diaphragm 100 with 103 is supported by "edge" 104.

Field structure 87 and edge 104 are connected to and supported by one piece frame structure 105 with back basket 102. In typical operation of dome with annular concentric section system 101 is similar to above mentioned conical loudspeaker.

Figure 19:
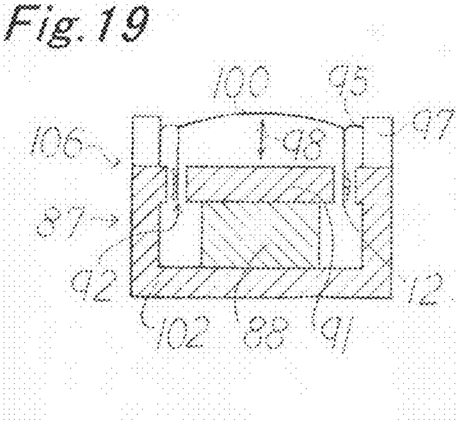
FIG. 19 is a central sectional view of a microphone according to the invention.

FIG. 19 shows a side cross-section of a common dynamic microphone system 106. Voice coil 12 induces a varying voltage fed to an external apparatus, such as, for example, an audio amplifier system (not shown). Microphone system 106 is constructed so that voice coil 12 is positioned within a constant magnetic field formed by field structure 87. A typical field structure 87 includes permanent magnet 88 coupled to pole piece 91 and back basket 102. Pole piece 91 forms gap 92 between it and back basket 102. Voice coil 12 is positioned within gap 92. Back basket 102 and pole pieces 91 are generally made of a highly permeable material such as iron, which provides a path for the magnetic field of magnet 88. Magnet 88 is typically made of rare earth material. An intense and constant magnetic field is formed in gap 92 where the magnetic circuit is completed. Voice coil 12 is movably supported and coupled to diaphragm 100 wherein an acoustic element is provided.

Diaphragm 100 is supported at its periphery by an outer suspension system 95. Outer suspension system 95 is also commonly called an "edge." Field structure 87 and edge 95 are connected to and supported by appropriate frame structure 97.

In typical operation, when an acoustic wave is applied to diaphragm 100, a corresponding reciprocal piston-like motion indicated by arrow 98 of the voice coil generates an electric signal at frequencies corresponding to the frequency of the acoustic wave.

Figure 20:
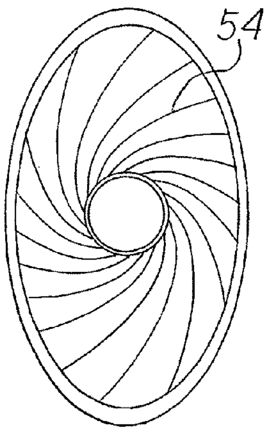
FIG. 20 shows a plan view of an oval acoustic diaphragm according to the invention.

It will be apparent that various changes may be made in the shape of the acoustic diaphragm, not only the circular but also oval, as shown in FIG. 20, square, rectangular and oblique, even flat panel type.

Figure 21:
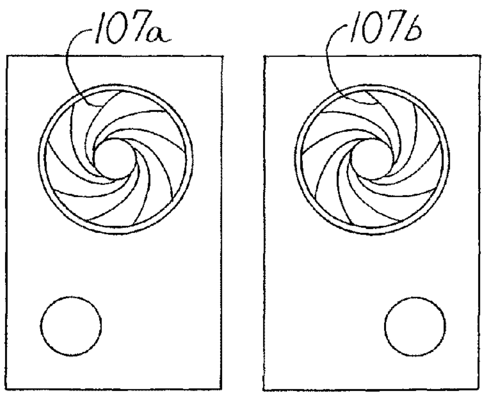
FIG. 21 shows an elevation view of a plural acoustic diaphragm set having a symmetrical helix therein according to the invention.

Because of symmetry of the ears and helical component in sound waves caused by an acoustic element, symmetric arrangements for the helix of acoustic elements, 107*a* and 107*b* in FIG. 21 are preferable for a multi-speaker set.

It is believed that the improved acoustic diaphragm and resulting improved electric to acoustic and acoustic to electric transducer systems of present invention and many of their attendant advantages will be understood from the foregoing description, and it will be apparent that various changes may be made in the form, construction and arrangement of the parts without departing from the spirit or scope of the invention or sacrificing all of the material advantages, the forms herein above described being merely preferred or exemplary embodiments thereof.

What is claimed:

1. An audio component system, comprising:

a plurality of sound producing devices, each sound producing device including at least one acoustic diaphragms, each said acoustic diaphragm being formed of a plurality of acoustic elements extending radially from a central portion of said acoustic diaphragm at an angle no more than ninety degrees to a normal, wherein at least one of said acoustic elements of one of said acoustic diaphragms is arranged at an angle to a normal which is in an opposite direction to that of at least one of said acoustic elements in another one of said acoustic diaphragms.

2. The audio component system of claim 1, wherein at least one of said acoustic elements has a portion which is not straight.

* * * * *